United States Patent
Watanabe et al.

(10) Patent No.: US 9,076,741 B2
(45) Date of Patent: Jul. 7, 2015

(54) LIGHT-EMITTING ELEMENT, IMAGE FORMING APPARATUS, IMAGE DISPLAY APPARATUS AND IMAGE READING APPARATUS

(71) Applicant: Konica Minolta, Inc., Chiyoda-ku (JP)

(72) Inventors: Yoshikazu Watanabe, Toyohashi (JP); Satoshi Masuda, Neyagawa (JP); Makoto Obayashi, Toyokawa (JP); Masayuki Iijima, Okazaki (JP); So Yano, Ibaraki (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/307,719

(22) Filed: Jun. 18, 2014

(65) Prior Publication Data

US 2014/0375743 A1     Dec. 25, 2014

(30) Foreign Application Priority Data

Jun. 19, 2013   (JP) ................................. 2013-128340

(51) Int. Cl.
  *H01L 27/32*   (2006.01)
  *H01L 51/52*   (2006.01)
  *G03G 15/04*   (2006.01)

(52) U.S. Cl.
  CPC ........ *H01L 27/3227* (2013.01); *H01L 51/5218* (2013.01); *H01L 51/5234* (2013.01); *G03G 15/04063* (2013.01)

(58) Field of Classification Search
  CPC ........... H01L 27/3227; H01L 51/5218; G03G 15/04063
  USPC ....... 347/224, 238, 241; 257/82, 98, E51.021
  See application file for complete search history.

(56) References Cited

U.S. PATENT DOCUMENTS

| | | | |
|---|---|---|---|
| 5,991,325 A * | 11/1999 | Ohtomo et al. | 372/69 |
| 7,675,249 B2 * | 3/2010 | Furukawa et al. | 315/309 |
| 2002/0135664 A1 | 9/2002 | Mashimo et al. | |
| 2004/0125196 A1 * | 7/2004 | Nomura et al. | 347/236 |
| 2010/0033078 A1 * | 2/2010 | Lee et al. | 313/498 |
| 2014/0301745 A1 * | 10/2014 | Otani | 399/15 |

FOREIGN PATENT DOCUMENTS

| | | |
|---|---|---|
| JP | 2000-77184 A | 3/2000 |
| JP | 2008-201136 A | 9/2008 |
| JP | 2011-156690 A | 8/2011 |

\* cited by examiner

*Primary Examiner* — Sarah Al Hashimi
(74) *Attorney, Agent, or Firm* — Buchanan Ingersoll & Rooney PC

(57) ABSTRACT

A light-emitting element having a light-emitting section and a light-receiving section provided on a substrate. The light-emitting section includes: an organic compound in which light is emitted; a translucent reflecting portion that transmits the emitted light which has spectral radiance changeable with changes in ambient temperature; and a transparent portion that radiates first part of the light coming through the translucent reflecting portion to outside and total-reflects second part that is light incident to a boundary surface therebetween at angles larger than a critical angle. Wherein, the light-receiving section is capable of receiving the light total-reflected at the boundary surface, the received light having a quantity of light changeable with changes in wavelength of the light passing through the translucent reflecting portion. The light-receiving section further outputs a signal which has an amplitude level in correlation to the quantity of light.

14 Claims, 24 Drawing Sheets

FIG. 1
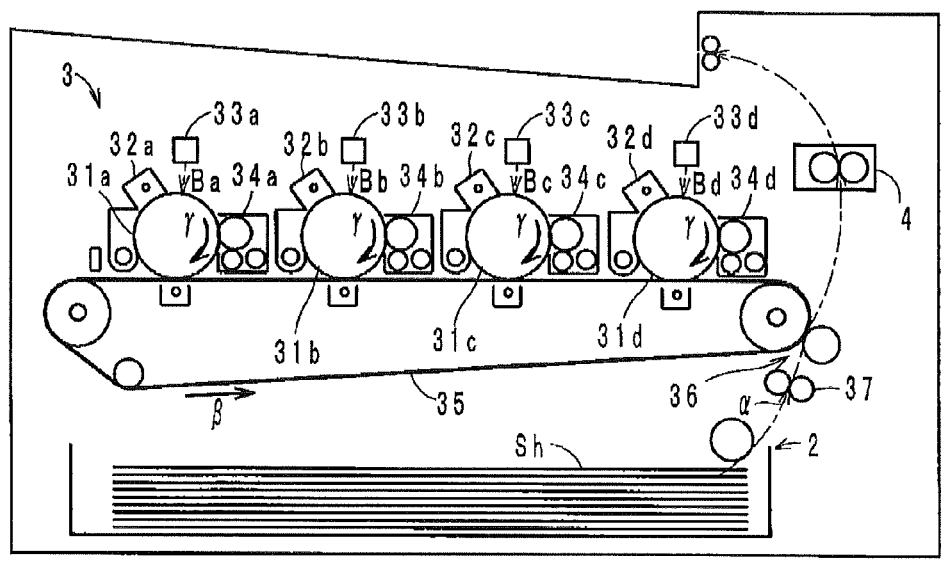
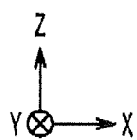

| REFERENCE TABLE | | | | | |
|---|---|---|---|---|---|
| SIGNAL | RATIO OF AMPLITUDE LEVELS | | | | |
| | PATTERN 1 | PATTERN 2 | | PATTERN m-1 | PATTERN m |
| $Si_8$ | 4.0 | 1.0 | ... | 0.0 | 0.0 |
| $Si_7$ | 2.5 | 3.9 | ... | 0.0 | 0.0 |
| $Si_6$ | 1.0 | 2.0 | ... | 3.5 | 0.0 |
| $Si_5$ | 0.0 | 0.7 | ... | 2.4 | 3.2 |
| $Si_4$ | 0.0 | 0.0 | ... | 1.3 | 2.0 |
| $Si_3$ | 0.0 | 0.0 | ... | 0.0 | 0.5 |
| $Si_2$ | 0.0 | 0.0 | ... | 0.0 | 0.0 |
| $Si_1$ | 0.0 | 0.0 | ... | 0.0 | 0.0 |
| WAVELENGTH | SHORT | ⟵⟶ | | | LONG |
| AMBIENT TEMPERATURE | HIGH (e.g. 50℃) | ⟵⟶ | | | LOW (e.g. 10℃) |
| CONTROL COEFFICIENT $C_1$ | 1.5 | 1.4 | ... | 0.8 | 0.7 |

F I G . 1 0
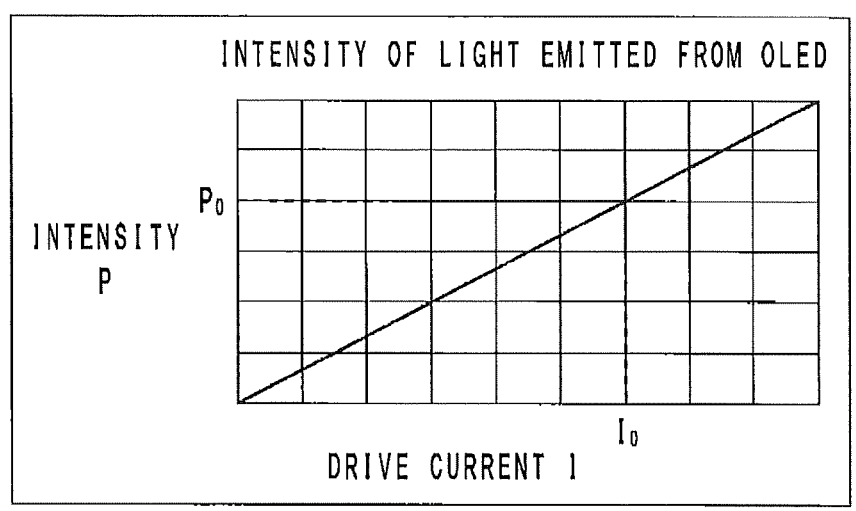

F I G . 1 1
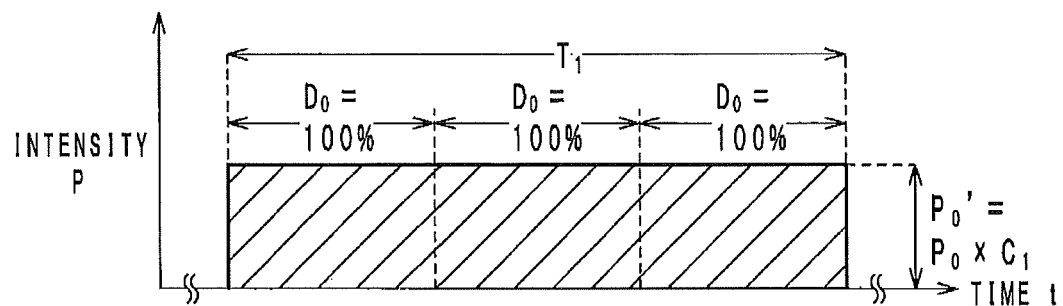
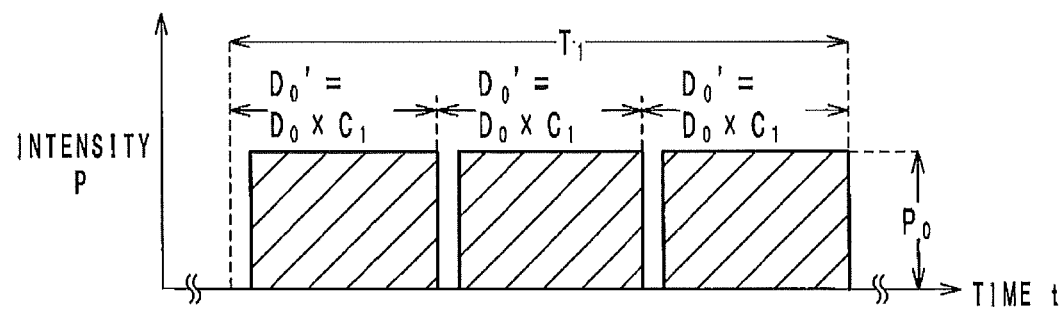

F I G . 1 2
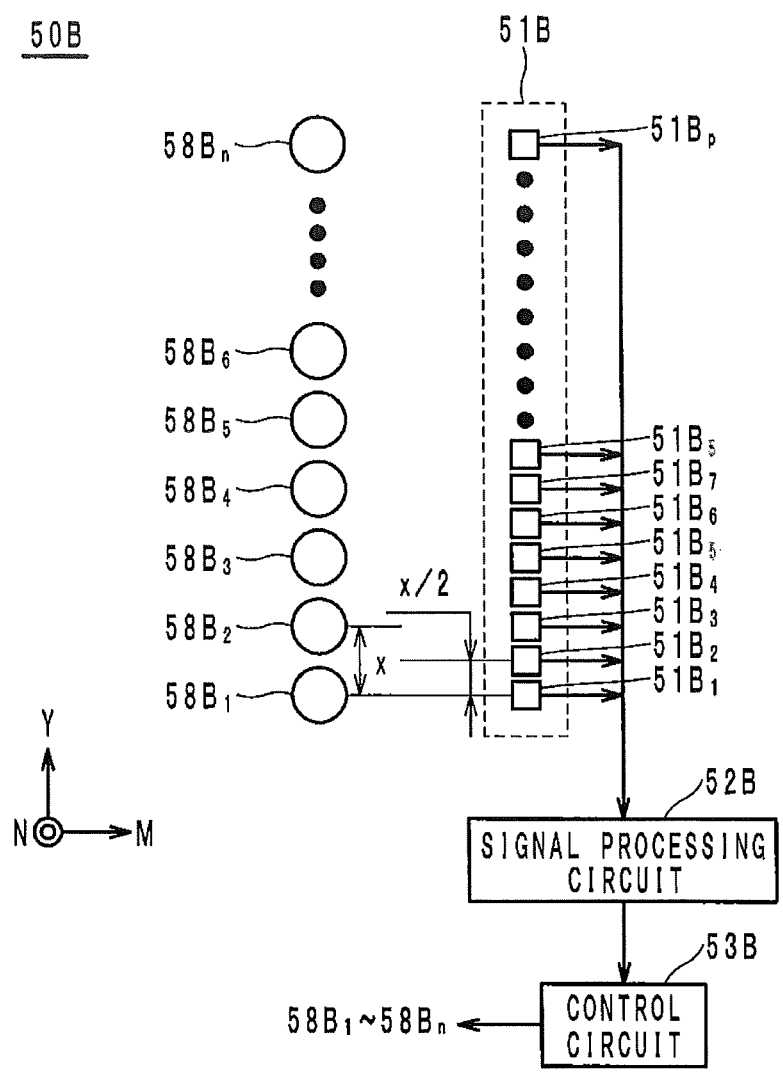

FIG. 13

| READING TABLE | | |
|---|---|---|
| LIGHT-EMITTING SECTION | OUTPUT SIGNAL $Si_q \sim Si_{q+7}$ | READING IN CONTROL CIRCUIT |
| $58B_n$ | $Si_{n-7} \sim Si_n$ | |
| $58B_4$ | $Si_7 \sim Si_{14}$ | $Si_1 \sim Si_8$ |
| $58B_3$ | $Si_5 \sim Si_{12}$ | |
| $58B_2$ | $Si_3 \sim Si_{10}$ | |
| $58B_1$ | $Si_1 \sim Si_8$ | |

| REFERENCE TABLE | | | | | |
|---|---|---|---|---|---|
| SIGNAL | RATIO OF AMPLITUDE LEVELS | | | | |
| | PATTERN 1 | PATTERN 2 | | PATTERN m-1 | PATTERN m |
| $Si_1$ | 4.0 | 1.0 | ... | 0.0 | 0.0 |
| $Si_2$ | 2.5 | 3.9 | ... | 0.0 | 0.0 |
| $Si_3$ | 1.0 | 2.0 | ... | 3.5 | 0.0 |
| $Si_4$ | 0.0 | 0.7 | ... | 2.4 | 3.2 |
| $Si_5$ | 0.0 | 0.0 | ... | 1.3 | 2.0 |
| $Si_6$ | 0.0 | 0.0 | ... | 0.0 | 0.5 |
| $Si_7$ | 0.0 | 0.0 | ... | 0.0 | 0.0 |
| $Si_8$ | 0.0 | 0.0 | ... | 0.0 | 0.0 |
| WAVELENGTH | SHORT | ⟵ | | ⟶ | LONG |
| AMBIENT TEMPERATURE | HIGH (e.g. 50℃) | ⟵ | | ⟶ | LOW (e.g. 10℃) |
| CONTROL COEFFICIENT $C_1$ | 1.5 | 1.4 | ... | 0.8 | 0.7 |

531C

FIG. 22
PRIOR ART
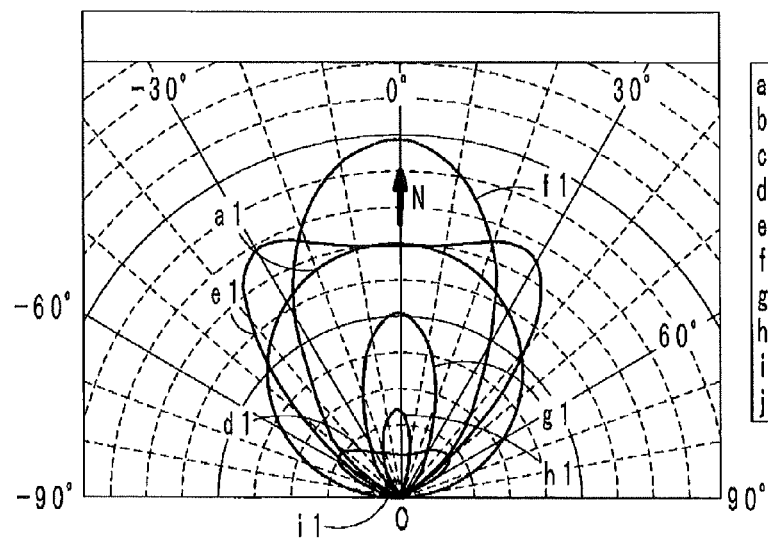
LIGHT DISTRIBUTION OF LIGHT-EMITTING ELEMENT 8
WITH OPTICAL RESONANCE STRUCTURE
a1: Lambertian
b1: 500-530nm
c1: 530-560nm
d1: 560-590nm
e1: 590-620nm
f1: 620-650nm
g1: 650-680nm
h1: 680-710nm
i1: 710-740nm
j1: 740-770nm
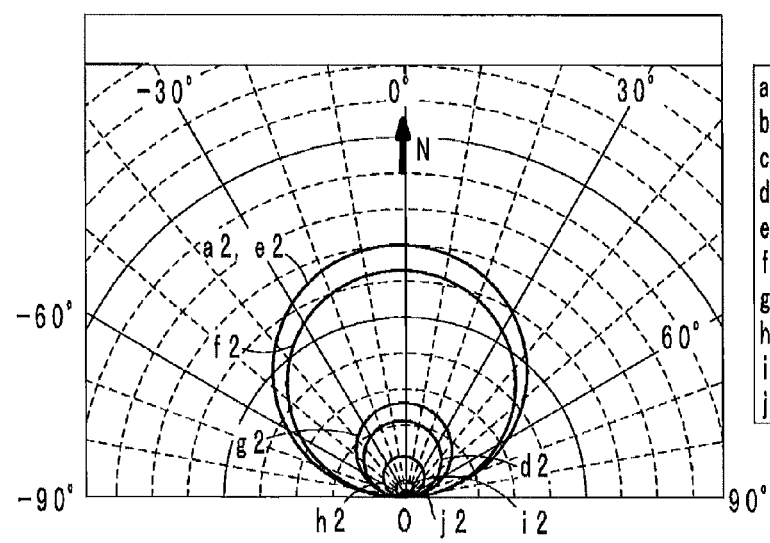
LIGHT DISTRIBUTION OF LIGHT-EMITTING ELEMENT 8
WITHOUT OPTICAL RESONANCE STRUCTURE
a2: Lambertian
b2: 500-530nm
c2: 530-560nm
d2: 560-590nm
e2: 590-620nm
f2: 620-650nm
g2: 650-680nm
h2: 680-710nm
i2: 710-740nm
j2: 740-770nm FIG. 23 PRIOR ART
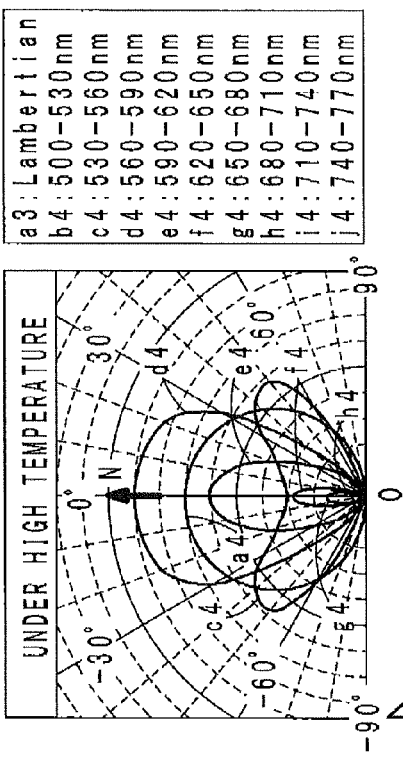
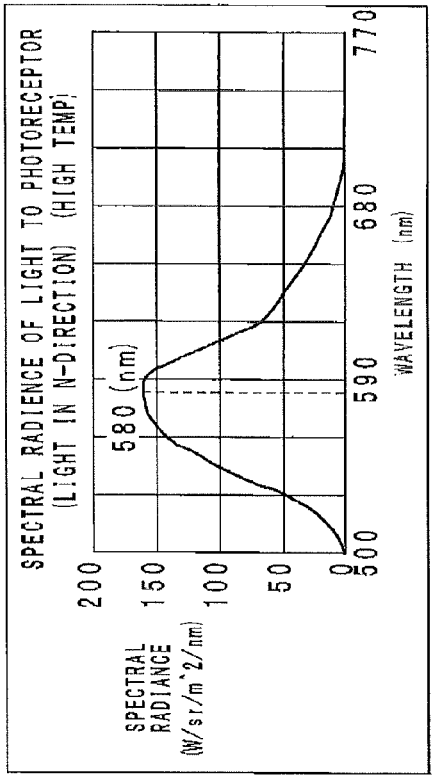
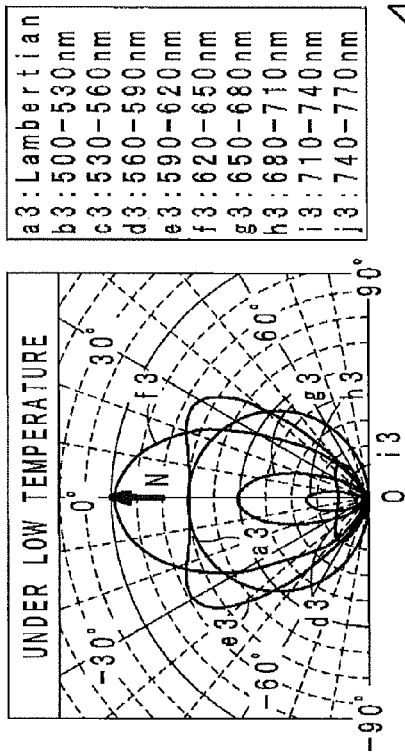
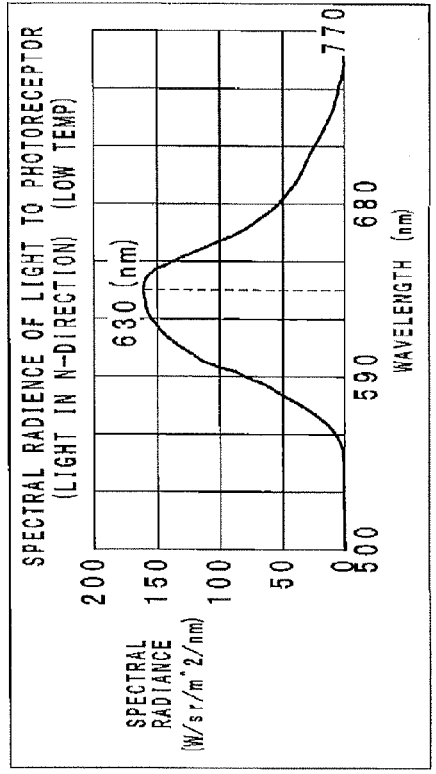

FIG. 25
PRIOR ART
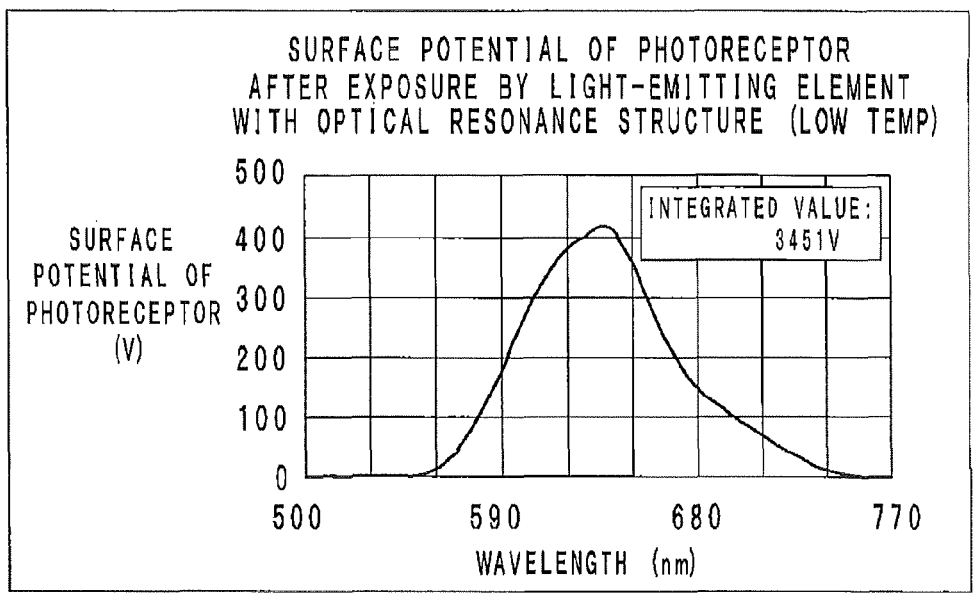
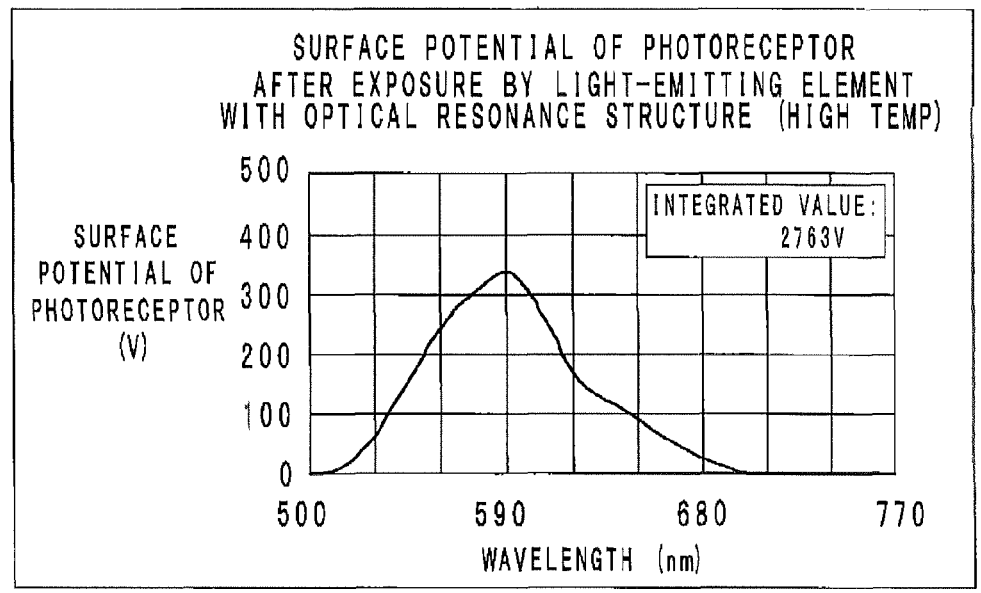

_US 9,076,741 B2_

LIGHT-EMITTING ELEMENT, IMAGE FORMING APPARATUS, IMAGE DISPLAY APPARATUS AND IMAGE READING APPARATUS

This application claims benefit of priority to Japanese Patent Application No. 2013-128340 filed on Jun. 19, 2013, the content of which is incorporated herein by reference.

BACKGROUND OF THE INVENTION

1. Field of the Invention

The present invention relates to a light-emitting element having an optical resonance structure, an image forming apparatus, an image display apparatus and an image reading apparatus comprising the light-emitting element.

2. Description of Related Art

As a conventional image forming apparatus comprising a light-emitting element of this kind, for example, an image forming apparatus disclosed by Japanese Patent Laid-Open Publication No. 2000-77184 is known. In the image forming apparatus, toner images in different colors are formed on corresponding photoreceptor drums by a conventional electrophotographic process.

In an electrophotographic process, a photoreceptor drum is exposed to light emitted from an exposure device, and an electrostatic latent image is formed on the photoreceptor drum. The exposure device comprises a light-emitting section 58 having an optical resonance structure as shown by FIG. 21 and a control circuit 9. The light-emitting section 58 generally comprises a first transparent portion 81 made of glass or the like, a cathode 82 made of aluminum or the like, an organic compound 83, an anode (ITO=indium tin oxide) 84, a plurality of translucent reflecting portions 85 (shown as 85A through 85C), and a second transparent portion 86 made of glass or the like. On the transparent section 81 serving as a substrate, the cathode 82, the organic compound 83, the anode 84 and the translucent reflecting portions 85A through 85C are stacked in this order, and on the top thereof, the transparent portion 86 is provided.

The control section 9 applies electric voltages to the cathode 82 and the anode 84. In response, electrons are injected in the organic compound 83 from the cathode 82, and holes are injected in the organic compound 83 from the anode 84. In the organic compound 83 between the layers 82 and 84, the holes and the electrons couple with each other, and light is emitted. The translucent reflecting sections 85 and the cathode 82 form a microstructure functioning as an optical resonator. Reflection and reciprocation of photons between these layers 82 and 85 induce resonance, and high-intensity light is emitted from the translucent reflecting portions 85 in a specified direction (toward the photoreceptor drum).

The upper section of FIG. 22 shows light distribution curves of the light-emitting section 58, and the lower section of FIG. 22 shows light distribution curves of a light-emitting device not having an optical resonance structure (which will be hereinafter referred to as a comparative example). Each of the light distribution curves is drawn with respect to each wavelength range. Each of the light distribution curves for each wavelength range shows the intensities of light radiating from a light-emitting point O in various directions. In FIG. 22, a line N showing the optical axis of the light-emitting section 58 is drawn virtually as a reference of directions. The directions are shown as degrees at which the reference line N is rotated on the light-emitting point O. The intensities of light radiating in various directions are shown as distances between the light-emitting point O and the respective points on the corresponding curve.

Both the light-emitting section 58 shown by FIG. 21 and the comparative example are operable to emit light within a wavelength range from 620 nm to 650 nm. In the upper section of FIG. 22, the curve denoted by f1 is a light distribution curve showing the distribution of light within this wavelength range emitted from the light-emitting section 58. In the lower section of FIG. 22, the curve denoted by f2 is a light distribution curve of light within this wavelength range emitted from the comparative example. In the upper section and in the lower section of FIG. 22, the same polar coordinate system is used. As is apparent from the light distribution curves f1 and f2, the light-emitting section 58 emits higher-intensity light in the direction of 0 degrees (in the direction of optical axis) than the comparative example. The same tendency is seen with respect to a wavelength range from 650 nm to 680 nm (see the light distribution curves g1 and g2) and with respect to wavelength range from 680 nm to 710 nm (see the light distribution curves h1 and h2).

However, such a light-emitting element having an optical resonance structure changes its light distribution characteristic and spectral radiance characteristic with changes in ambient temperature.

Accordingly, an image forming apparatus employing such a light-emitting element has a problem that the image density varies with changes in ambient temperature due to the temperature characteristic of the light-emitting element of emitting light with spectral radiance changeable with changes in temperature. In the following, this problem is described with reference to FIGS. 23 through 25.

The left section of FIG. 23 shows distribution of light emitted from such a light-emitting element and spectral radiance of the light traveling to a photoreceptor drum when the ambient temperature is low. The right section of FIG. 23 shows distribution of light emitted from the light-emitting element and spectral radiance of the light traveling to the photoreceptor drum when the ambient temperature is high. As is apparent from FIG. 23, the radiance around the wavelength of 630 nm is great under low temperature, while the radiance around the wavelength of 580 nm is great under high temperature. The photoreceptor drum has a spectral sensitivity characteristic as shown by FIG. 24, and the sensitivity of the photoreceptor drum varies depending on the wavelength of light radiated thereto. Therefore, as shown by FIG. 25, with a change in ambient temperature around the light-emitting element, the surface potential of the photoreceptor drum after exposure changes, and consequently, the image density changes.

Such a light-emitting element having an optical resonance structure may be used not only in an image forming apparatus but also in an image display apparatus as a pixel and in an image reading apparatus as an element of an illuminating device operable to illuminate a document. When the light-emitting element is used for these purposes, changes in ambient temperature affect the display colors of the image display apparatus or the image data produced by the image reading apparatus.

SUMMARY OF THE INVENTION

An object of the present invention is to provide a light-emitting element that is capable of detecting a change in distribution of light emitted therefrom with a change in ambient temperature. Another object of the present invention is to provide an image forming apparatus, an image display apparatus and an image reading apparatus comprising the light-emitting element.

According to an aspect of the present invention, a light-emitting element comprises: a light-emitting section and a light-receiving section provided on a substrate. The light-emitting section comprises: an anode and a cathode; an organic compound provided between the anode and the cathode, wherein holes injected from the anode and electrons injected from the cathode couple with each other, thereby emitting light; a translucent reflecting portion provided on the anode and making an optical resonance structure with the cathode, the translucent reflecting portion being configured to transmit the light emitted in the organic compound, the light having spectral radiance changeable with changes in ambient temperature; and a transparent portion provided on the translucent reflecting portion and configured to radiate first part of the light coming through the translucent reflecting portion to outside and to total-reflect second part of the light coming through the translucent reflecting portion, the second part of the light being light incident to a boundary surface between the transparent portion and outside at angles larger than a critical angle. The light-receiving section is arranged to be capable of receiving the light total-reflected at the boundary surface and is configured to output a signal, the light received by the light-receiving section having a quantity of light changeable with changes in wavelength of the light passing through the translucent reflecting portion, and the signal having an amplitude level in correlation to the quantity of light.

The light-emitting element above can be used, for example, in an image forming apparatus, an image display apparatus or an image reading apparatus.

BRIEF DESCRIPTION OF THE DRAWINGS

FIG. 1 is a view showing the structure of an image forming apparatus employing a light-emitting element according to an embodiment of the present invention.

FIG. 9 is a reference table stored in a control circuit shown in FIG. 3.

FIG. 10 is a graph depicting intensity of light emitted from each light-emitting element in the OLED-PH shown by FIG. 2 relative to a drive current supplied thereto.

FIG. 11 shows ways of carrying out temperature compensation of exposure energy, the upper section showing temperature compensation of a drive current supplied to each light-emitting element, and the lower section showing temperature compensation of a duty factor of each light-emitting element.

FIG. 12 is a schematic view of a light-emitting element according to a first modification.

FIG. 13 shows a reading table stored in a control circuit shown in FIG. 12.

FIG. 18 shows a reference table stored in a control circuit shown in FIG. 16.

FIG. 22 shows graphs depicting light distribution, the graph in the upper section showing light distribution curves representing distribution of light emitted from the light-emitting element shown by FIG. 21, and the graph in the lower section showing light distribution curves representing distribution of light emitted from a comparative light-emitting element.

FIG. 23 shows graphs depicting distribution of light emitted from the light-emitting element shown by FIG. 21, the graphs in the left section showing light distribution curves and spectral radiance when the ambient temperature is low, and the graphs in the right section showing light distribution curves and spectral radiance when the ambient temperature is high.

FIG. 25 shows graphs depicting a surface potential of the photoreceptor drum relative to wavelength of light radiated thereto, the graph in the upper section showing the surface potential when the ambient temperature is low, and the graph in the lower section showing the surface potential when the ambient temperature is high.

DETAILED DESCRIPTION OF THE PREFERRED EMBODIMENTS

First Embodiment

Figure 2:
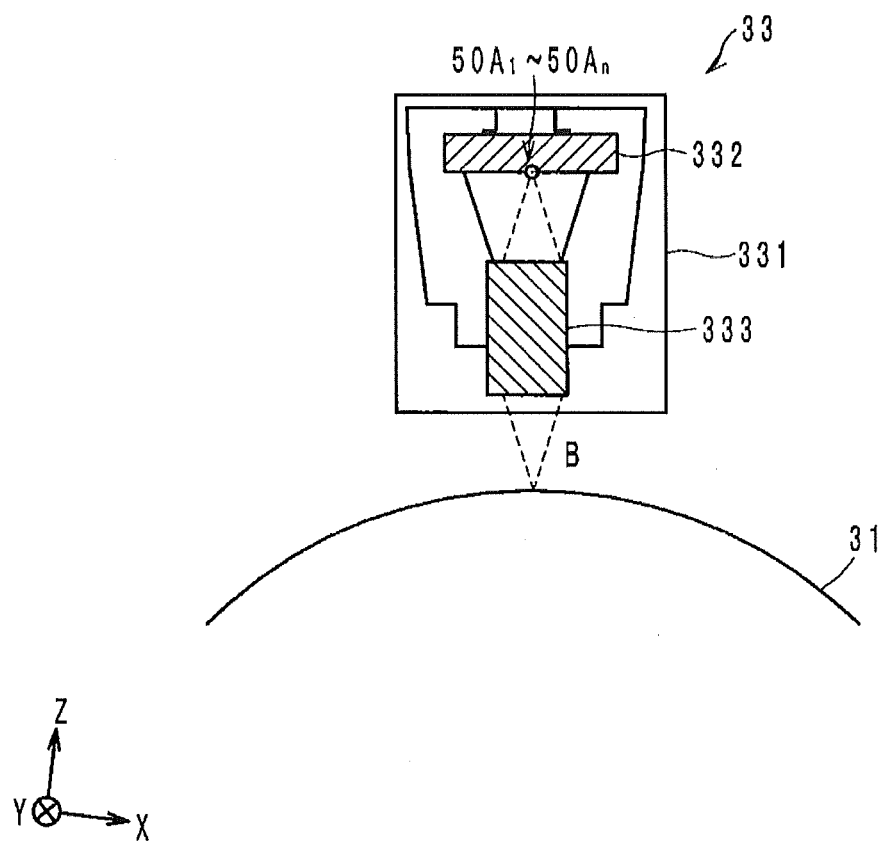
FIG. 2 is a longitudinal sectional view of an OLED-PH shown in FIG. 1.

An image forming apparatus comprising a light-emitting element according to an embodiment of the present invention is described with reference to the drawings.

Introduction

In the drawings, the X-axis, the Y-axis and the Z-axis show the horizontal (right-left) direction, the depth (front-back)

direction and the vertical (up-down) direction of the image forming apparatus. The Y-axis shows a main-scanning direction of a light beam on a photoreceptor drum 31.

In the drawings, some elements are denoted by reference marks with a, b, c or d suffixed to reference numbers. The suffixes a, b, c and d mean yellow (Y), magenta (M), cyan (C) and black (Bk), respectively. For example, a photoreceptor drum 31a means a photoreceptor drum 31 for yellow. A reference mark with no suffix means an element for each of the colors Y, M, C and Bk. For example, a photoreceptor drum 31 means each of the photoreceptor drums for the colors Y, M, C and Bk.

Structure and Operation of the Image Forming Apparatus

In FIG. 1, the image forming apparatus 1, which is, for example, an MFP (multifunction peripheral), forms a full-color image on a sheet (for example, a paper or an OHP film) by a tandem method. The image forming apparatus 1 generally comprises a sheet feed unit 2, an image forming unit 3 and a fixing device 4.

In the sheet feed unit 2, a plurality of sheets Sh are stacked. The sheet feed unit 2 picks up the topmost one from the stack of sheets Sh and feeds the sheet Sh into a sheet path shown by arrow α of alternate long and short dashed line (which will be hereinafter called sheet path a).

In the image forming unit 3, while photoreceptor drums 31a through 31d are rotating in a direction shown by arrow γ, the peripheral surfaces of the photoreceptor drums 31a through 31d are charged by chargers 32a through 32d, respectively. Thereafter, the peripheral surfaces of the photoreceptor drums 31a through 31d are exposed to light beams Ba through Bd emitted from print heads 33a through 33d using organic OLEDs (organic light-emitting diodes), respectively, and electrostatic latent images of Y, M, C and Bk are formed. (Each of the print heads will be hereinafter referred to as an OLED-PH.) The developing devices 34a through 34d supply toner to the respectively corresponding electrostatic latent images to form toner images in the respective colors, Y, M, C and Bk, on the peripheral surfaces of the photoreceptor drums 31a through 31d. These toner images are transferred sequentially on the same area of an intermediate transfer belt 35 (primary transfer) while the intermediate transfer belt 35 is rotating in a direction shown by arrow β. By this primary transfer, the toner images in the respective colors are combined, thereby resulting in a full-color composite toner image on the intermediate transfer belt 35. The composite toner image is supported and carried by the intermediate transfer belt 35 to the secondary transfer roller 27.

In the meantime, the sheet Sh fed into the sheet path α by the sheet feed unit 2 hits against a pair of timing rollers 37 in a stop state. Thereafter, the pair of timing rollers 37 are started to rotate with proper timing for transfer at a secondary transfer area 36, and the stopped sheet Sh is fed toward the secondary transfer area 36.

At the secondary transfer area 36, the composite toner image on the intermediate transfer belt 31 is transferred to the sheet Sh fed from the pair of timing rollers 37 (secondary transfer). The sheet Sh after subjected to the secondary transfer is fed downstream along the sheet path α as an unfixed sheet Sh.

The fixing device 4 is, for example, of a heating-roller type, and comprises a pair of rollers in contact with each other to form a nip portion. The unfixed sheet Sh is fed into the nip portion. While the sheet Sh is passing through the nip portion, the fixing device 4 applies heat and pressure to the sheet Sh with the pair of rollers. Thereby, the composite toner image on the sheet Sh is fixed thereon. The sheet Sh after subjected to the fixing process is fed downstream along the sheet path α and is ejected from the image forming apparatus 1.

Detailed Structure of the OLED-PH

Each of the OLED-PHs 33 for each color is located between the corresponding charger 32 and the corresponding developing device 34 to face the peripheral surface of the photoreceptor drum 31. Each of the OLED-PHs 33 generates light beams B for the corresponding color and scans the peripheral surface of the corresponding photoreceptor drum 31 with the light beams B in a main scanning direction (Y-axis direction). For this purpose, each of the OLED-PHs 33 comprises, as shown by FIG. 2, a holder 331, and an OLED substrate 332 and an optical imaging system 333 held in the holder 331.

The holder 331 extends in parallel to the corresponding photoreceptor drum 31 and is opposed to an exposure position where the peripheral surface of the photoreceptor 31 is exposed to the light beams B.

The OLED substrate 332 supports light-emitting elements $50A_1, 50A_2, 50A_3, \ldots 50A_n$, of which number is equal to the number of dots in one line in the main-scanning direction. (For example, ten thousands and several thousands of light-emitting elements are provided). Each of the light-emitting elements $50A_1$ through $50A_n$ comprises an OLED, and the light-emitting elements $50A_1$ through $50A_n$ are arranged in a line in the main-scanning direction to form a light-emitting element array. The light-emitting element array is located on the OLED substrate 332 so as to face the peripheral surface of the corresponding photoreceptor drum 31. Each of the light-emitting elements $50A_1$ through $50A_n$ emits light with intensity according to the drive current input thereto, and the light beams B are radiated to the peripheral surface of the corresponding photoreceptor drum 31.

The optical imaging system 333 is held in the holder 331 so as to be located between the array of light-emitting elements $50A_1$ through $50A_n$ and the photoreceptor drum 31. The optical imaging system 333 is, for example, a micro lens array (MLA), a light collection transmitter array or the like. The optical imaging system 333 focuses the light beams B emitted from the light-emitting elements $50A_1$ through $50A_n$ on the peripheral surface of the corresponding photoreceptor drum 31. Thereby, the peripheral surface of the photoreceptor drum 31 is scanned with the light beams B, and an electrostatic latent image is formed on the photoreceptor drum 31.

Detailed Description of the OLED Substrate

Figure 3:
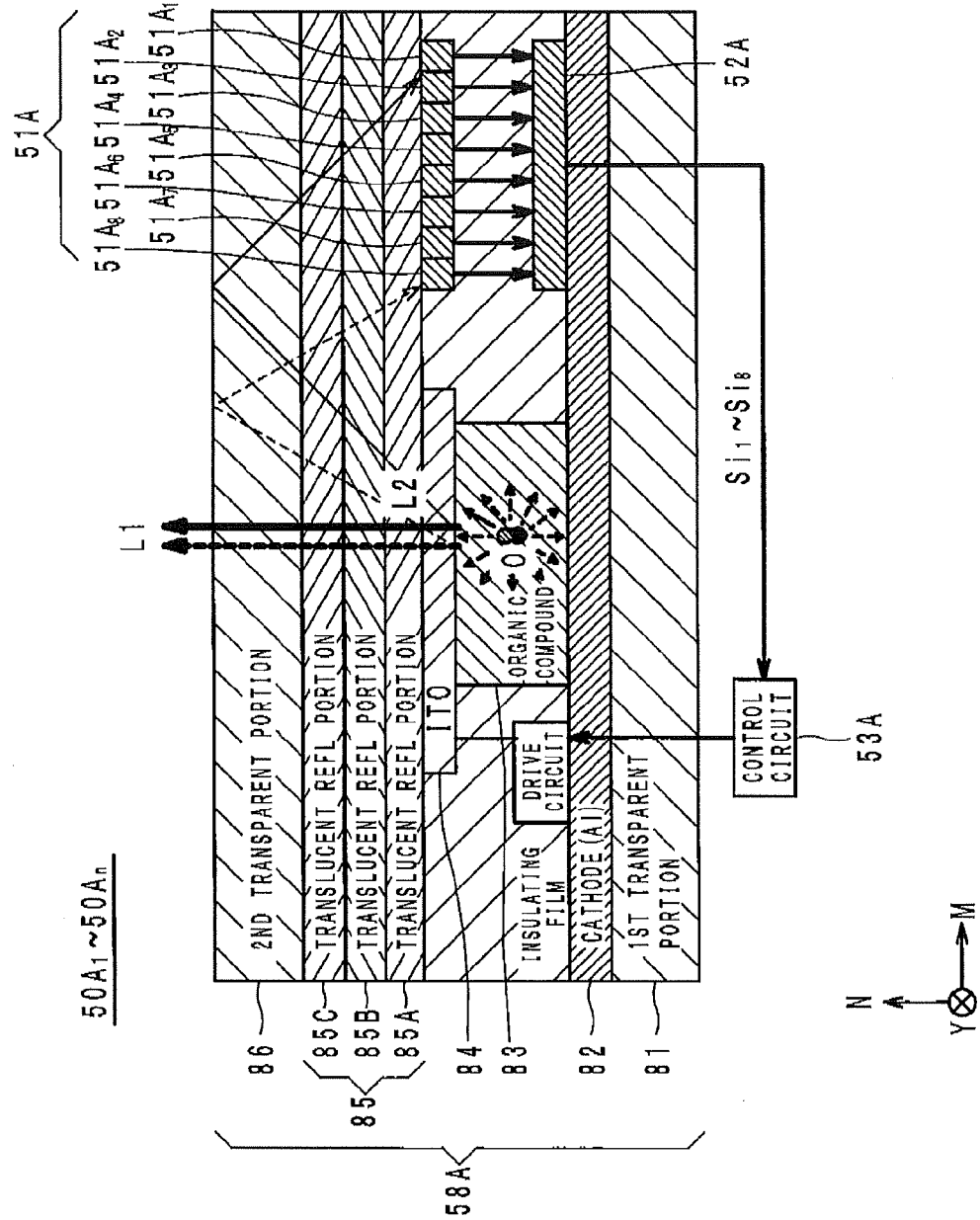
FIG. 3 is a longitudinal sectional view of each light-emitting element in the OLED-PH shown by FIG. 2.

Next, referring to FIG. 3, each of the light-emitting elements $50A_1$ through $50A_n$ shown in FIG. 2 is described. Before that, the Y-axis, the M-axis and the N-axis in FIG. 3 are defined. The Y-axis shows the main-scanning direction of the light beams B. The M-axis shows a sub-scanning direction of the light beams B. The N-axis shows the direction of optical axes of the light-emitting elements $50A_1$ through $50A_n$. The N-axis is perpendicular to the Y-axis and the M-axis.

Figure 21:
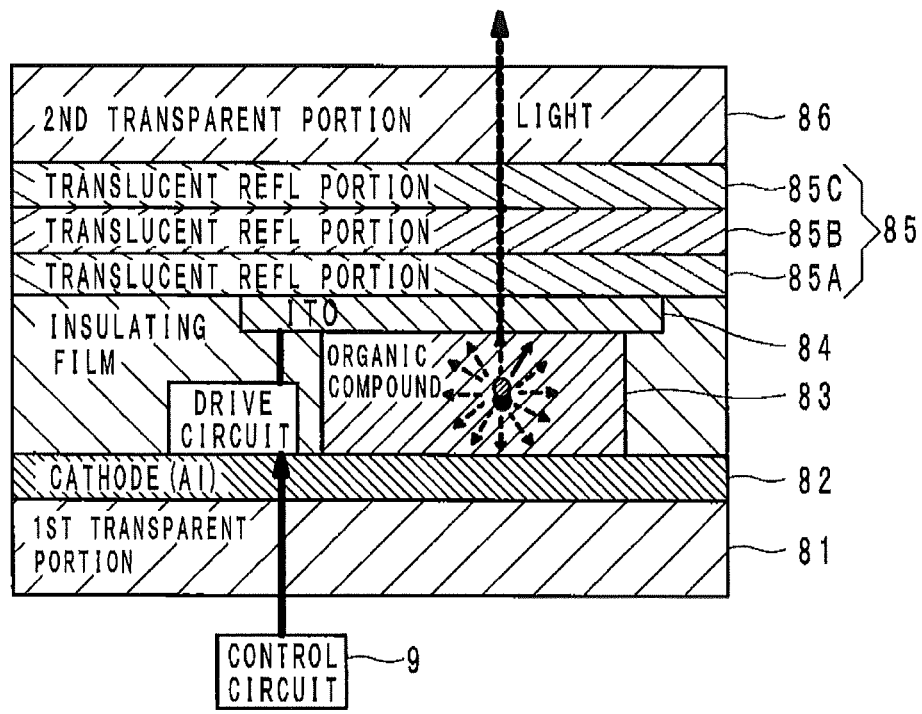
FIG. 21 is a longitudinal sectional view of a light-emitting element, showing a detailed structure thereof.

Each of the light-emitting elements $50A_1$ through $50A_n$ comprises a light-emitting section 58A, a light-receiving section 51A and a signal processing circuit 52A. The light-emitting section 58A of each of the light-emitting elements $50A_1$ through $50A_n$ has no differences from the light-emitting section 58 shown by FIG. 21. Therefore, the constituent elements of the light-emitting section 58A corresponding to those shown in FIG. 21 are provided with the same reference marks as shown in FIG. 21, and descriptions of these constituent elements are omitted.

As described above, the light-emitting elements $50A_1$ through $50A_n$ (more exactly, the light-emitting sections 58A) has a temperature characteristic of emitting light changeable with changes in temperature, and light emitted from each of the light-emitting elements $50A_1$ through $50A_n$ is distributed from the N-axis. More specifically, part of light generated in the organic compound 83 propagates in directions along and around the N-axis through the translucent reflecting portions 85 and the transparent portion 86, passes through the optical imaging system 333 and outgoes as light $L_1$ traveling toward the photoreceptor drum 31 (see FIG. 2).

Other part of light generated by each of the light-emitting element $50A_1$ through $50A_n$ does not outgo toward the photoreceptor drum 31. This part of light propagates in a direction inclined from the N-axis through the translucent reflecting portions 85 and the transparent portion 86 and is transmitted by or reflected at the boundary surface between the transparent portion 86 and the outside. At that time, rays incident to the boundary surface between the transparent portion 86 and the outside at angles larger than a critical angle are total-reflected at the boundary surface as non-outgoing light $L_2$.

Figure 4:
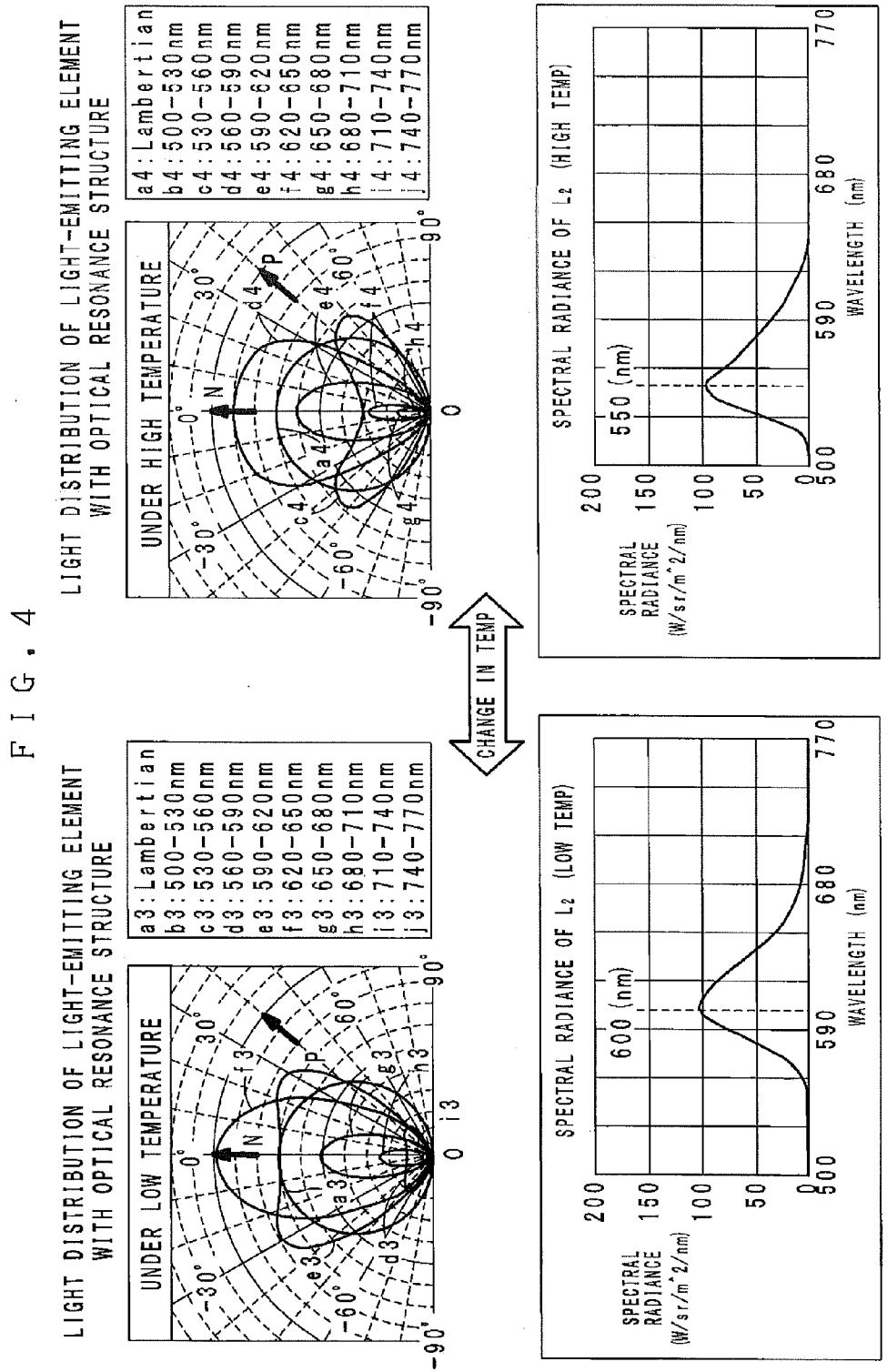
FIG. 4 shows graphs depicting spectral radiance of non-outgoing light in the OLED-PH shown by FIG. 2 when the ambient temperature is high and low, respectively.

The spectral radiance of the non-outgoing light $L_2$ is also changeable with changes in temperature. The left section of FIG. 4 shows the spectral radiance of the non-outgoing light $L_2$ when the ambient temperature is low, and the right section of FIG. 4 shows the spectral radiance of the non-outgoing light $L_2$ when the ambient temperature is high. As shown by FIG. 4, when the ambient temperature is low, the non-outgoing light $L_2$ has high radiance at a wavelength around 600 nm, and when the ambient temperature is high, the non-outgoing light $L_2$ has high radiance at a wavelength around 550 nm. As FIG. 23 does, FIG. 4 also shows light distribution curves when the ambient temperature is low and when the ambient temperature is high. In the graphs showing the light distribution curves, the direction of the non-outgoing light $L_2$ traveling toward the light-receiving section 51A, which will be described later, is shown by arrow P.

Now, referring to FIG. 3 again, the light-receiving section 51A is located in a position to be capable of receiving the non-outgoing light $L_2$. In this embodiment, the light-receiving section 51A comprises a plurality of photodiodes (which will be hereinafter referred to as PDs). FIG. 3 shows an example where the light-receiving section 51A comprises eight PDs $51A_1$ to $51A_8$.

More specifically, the PDs $51A_1$ to $51A_8$ are arranged in a line along the M-axis and structured as an array. In other words, the PDs $51A_1$ to $51A_8$ are located on the first transparent portion 81, at different distances from the light-emitting point in the organic compound 83 of the light-emitting section 58A. With respect to the N-axis direction, the light-receiving surfaces of the respective PDs $51A_1$ to $51A_8$ are located substantially in the same positions as the anode 84. Also, the light-receiving surfaces of the PDs $51A_1$ to $51A_8$ are equal in size. On the light-receiving surfaces of the respective PDs $51A_1$ to $51A_8$, the translucent reflecting portion 85C is formed. The PDs $51A_1$ to $51A_8$ generate electric signals $Si_1$ through $Si_8$ having amplitude levels in correlation to the intensities of light incident to their respective light-receiving surfaces, and output the signals through $Si_8$ to the signal processing circuit 52A arranged in the subsequent stage.

Figure 5:
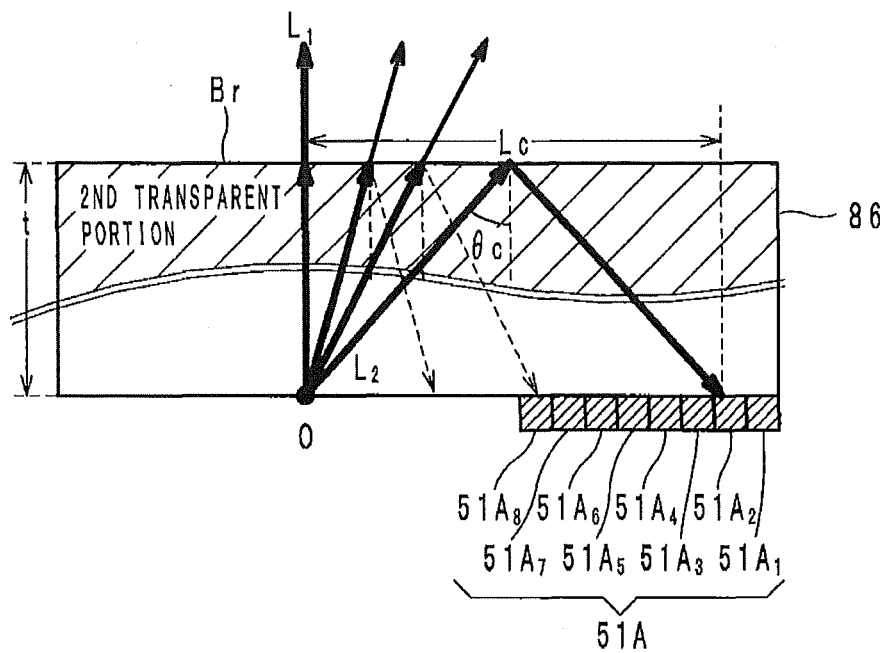
FIG. 5 shows a reach of the non-outgoing light in M-axis direction in the OLED-PH shown by FIG. 2.

As shown by FIG. 5, the reach Lc in the M-axis direction of the non-outgoing light $L_2$ from the light-emitting point O can be calculated as follows.

$$Lc = 2 \times t \times \tan \theta c \quad (1)$$

In the expression (1), t denotes the distance in the N-axis direction from the light-emitting point O to the boundary surface Br between the transparent portion 86 and the outside, and θc denotes the critical angle of the non-outgoing light $L_2$ at the boundary surface Br. Rays incident to the boundary surface Br at angles smaller than the critical angle θc mostly pass through the boundary surface Br and goes to the outside, and therefore, light with sufficient intensity does not reach the PDs $51A_1$ to $51A_8$.

Figure 6:
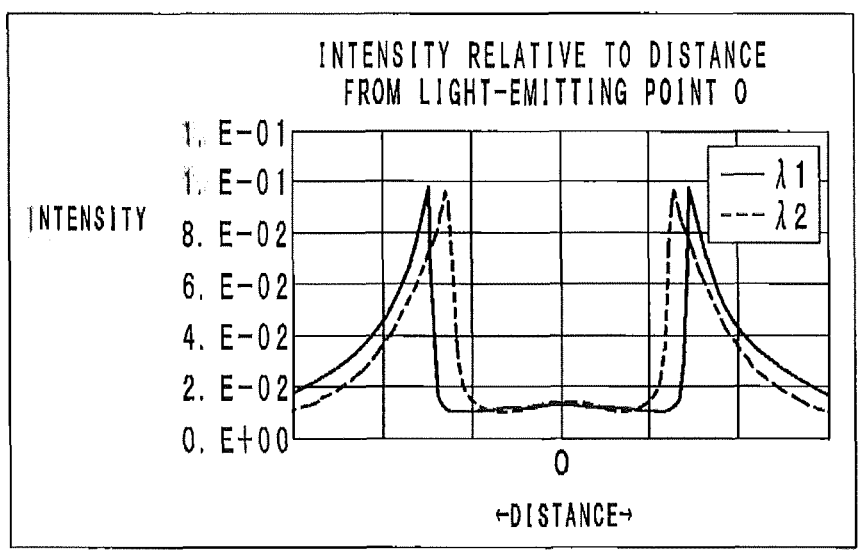
FIG. 6 is a graph depicting intensity characteristics of the non-outgoing light in relation to the distance from each light-emitting point in the OLED-PH shown by FIG. 2.

The critical angle θc is dependent on wavelength. Accordingly, the reach Lc of the non-outgoing light $L_2$ changes with changes of the wavelength. FIG. 6 shows light-intensity characteristics of the non-outgoing light $L_2$ relative to the distance Lc from the light-emitting point O when the non-outgoing light $L_2$ is of a wavelength $\lambda_1$ and when the non-outgoing light $L_2$ is of a wavelength $\lambda_2$ ($\lambda_2 \neq \lambda_1$). Also, the wavelength of the non-outgoing light $L_2$ changes with changes in ambient temperature. Accordingly, the reach Lc of the non-outgoing light $L_2$ changes with changes in ambient temperature. In the case shown by FIG. 6, each of the light-emitting elements $50A_1$ through $50A_n$ generates non-outgoing light $L_2$ of a wavelength $\lambda_1$ when the ambient temperature is low, and generates non-outgoing light $L_2$ of a wavelength $\lambda_2$ when the ambient temperature is high. The PDs $51A_1$ to $51A_8$ are positioned in consideration of the temperature characteristic that the reach Lc of the non-outgoing light $L_2$ changes with changes in ambient temperature. For example, one of the PDs $51A_1$ to $51A_8$ is positioned at a distance from the light-emitting point O corresponding to the reach Lc of the non-outgoing light $L_2$ when the ambient temperature is a predetermined temperature, and the other PDs 51A are positioned around the PD.

Figure 7:
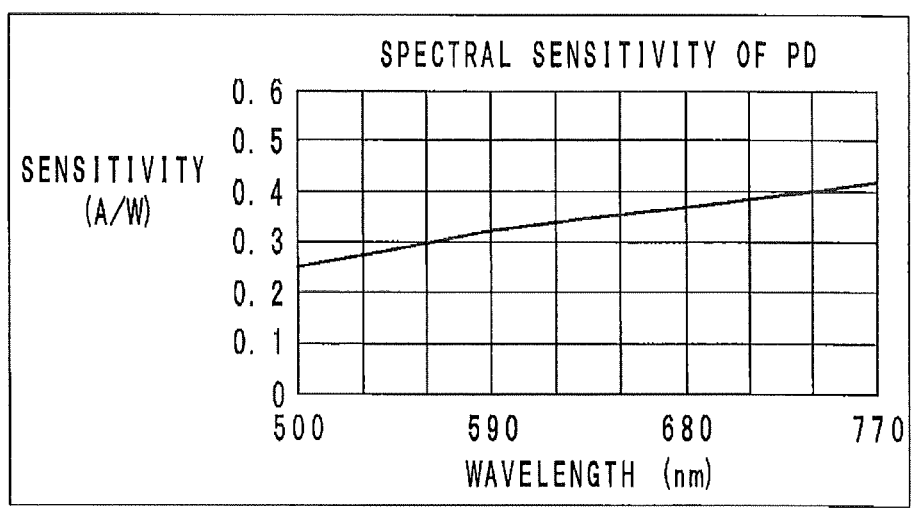
FIG. 7 is a graph depicting a spectral sensitivity characteristic of each light-receiving element shown in FIG. 3.

Each of the PDs $51A_1$ through $51A_8$ has a spectral sensitivity characteristic as shown by FIG. 7. That is, each of the PDs $51A_1$ through $51A_8$ has different light-receiving sensitivities to different wavelengths of incident light.

Figure 8:
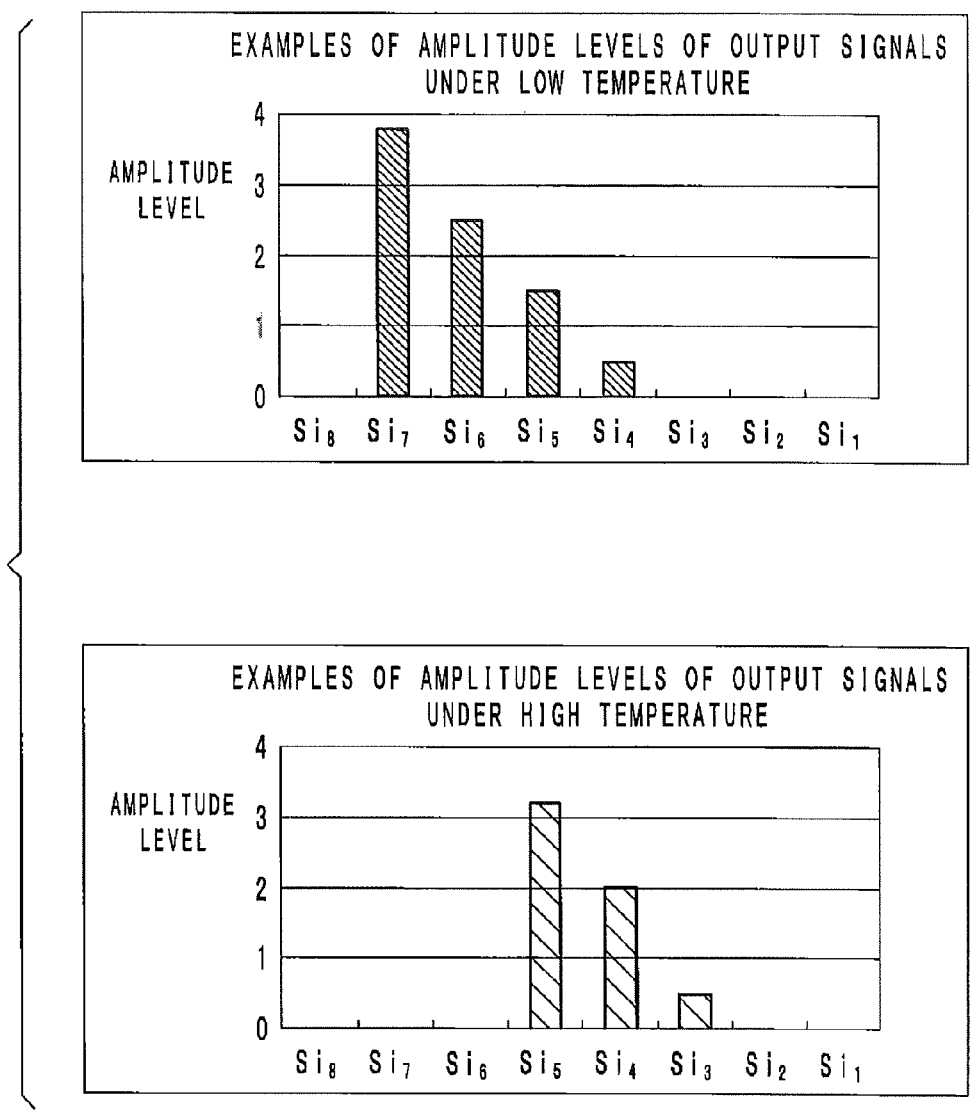
FIG. 8 shows graphs depicting amplitude levels of output signals from the light-receiving elements shown in FIG. 3, the graph in the upper section showing a combination of amplitude levels when the ambient temperature is low, and the graph in the lower section showing a combination of amplitude levels when the ambient temperature is high.

Due to the reach Lc of the non-outgoing light $L_2$ changeable with changes in temperature and the spectral sensitivity characteristic of each of the PDs $51A_1$ to $51A_8$, the amplitude levels of the output signals $Si_1$ through $Si_8$ change with changes in ambient temperature. In other words, a combination of amplitude levels of the output signals $Si_1$ through $Si_8$ shows the ambient temperature at that time. The upper section of FIG. 8 shows amplitude levels of the output signals $Si_1$ through $Si_8$ when the ambient temperature is low, and the lower section of FIG. 8 shows amplitude levels of the output signals $Si_1$ through $Si_8$ when the ambient temperature is high.

Referring back to FIG. 3 again, the signal processing circuit 52A is located on the cathode 82 and configured to receive the output signals from the PDs $51A_1$ to $51A_8$. At least once during an exposure process, the signal processing circuit 52A receives the output signals $Si_1$ through $Si_8$ from all of the PDs $51A_1$ to $51A_8$. The signal processing circuit 52A carries out signal processing such as ADC (analog-to-digital conversion), etc. on the received signals $Si_1$ through $Si_8$, and outputs serial data comprising time-series data of the amplitude levels of the signals $Si_1$ through $Si_8$ to the control circuit 53A. For example, the serial data includes rates of the amplitude levels of the respective output signals $Si_1$ through $Si_8$ to a reference level.

The control circuit 53A, which is provided in the image forming apparatus 1, is connected to and data-communicable with the signal processing circuits 52A of the respective light-emitting elements 50A. The control circuit 53A is, for example, mounted on a control circuit board controlling the constituent elements of the image forming apparatus 1, and comprises a microcomputer, a main memory, a non-volatile memory, etc.

In the non-volatile memory or the like of the control circuit 53A, a reference table 531A as shown by FIG. 9 is preliminarily stored. The reference table 531A shows control coefficients $C_1$ for various combination patterns of amplitude levels included in the serial data. The control coefficients $C_1$ are determined according to the relation between the spectral sensitivity of the photoreceptor drum 31 and the wavelength of the outgoing light $L_1$ traveling toward the photoreceptor drum 31. The control coefficients $C_1$ are such values that changes in wavelength of light emitted from the light-emitting elements $50A_1$ through $50A_n$ due to changes in ambient temperature will cause substantially no change of the surface potential of the photoreceptor drum 31. FIG. 9 shows exemplary control coefficients $C_1$ in a case where there are m combination patterns of amplitude levels. According to the reference table 531A shown by FIG. 9, when the ratio of amplitude levels of the signals $Si_1$ through $Si_8$ is in a first pattern (that is, $Si_8:Si_7:Si_6:Si_5:Si_4:Si_3:Si_2:Si_1=4.0:2.5:1.0:0.0:0.0:0.0:0.0:0.0$), the control coefficient $C_1$ is 1.5. This coefficient of 1.5 is used when the non-outgoing light $L_2$ is of a short wavelength and the ambient temperature is high (for example, 50 degrees C.). Also, when the ratio of amplitude levels of the signals $Si_1$ through $Si_8$ is in an mth pattern (that is, $Si_8:Si_7:Si_6:Si_5:Si_4:Si_3:Si_2:Si_1=0.0:0.0:0.0:3.2:2.0:0.5:0.0:0.0$), the control coefficient $C_1$ is 0.7. This coefficient of 0.7 is used when the non-outgoing light $L_2$ is of a long wavelength and the ambient temperature is low (for example, 10 degrees C.).

Each of the light-emitting elements $50A_1$ through $50A_n$ is designed to emit light with a predetermined intensity Po and to have a predetermined duty factor D. The coefficient indicating the PIDC (photo-induced discharge curve) of the photoreceptor drum 31, which is derivable from an experiment or the like, is denoted by $C_2$. The exposure energy (exposure value) is denoted by E, and the surface potential of the photoreceptor drum 31 is denoted by Vs. In this case, basically, the exposure energy E and the surface potential Vs are expressed as follows.

$$E = Po \times C_1 \times D \quad (2)$$

$$Vs = C_2 \times E \quad (3)$$

Figure 24:
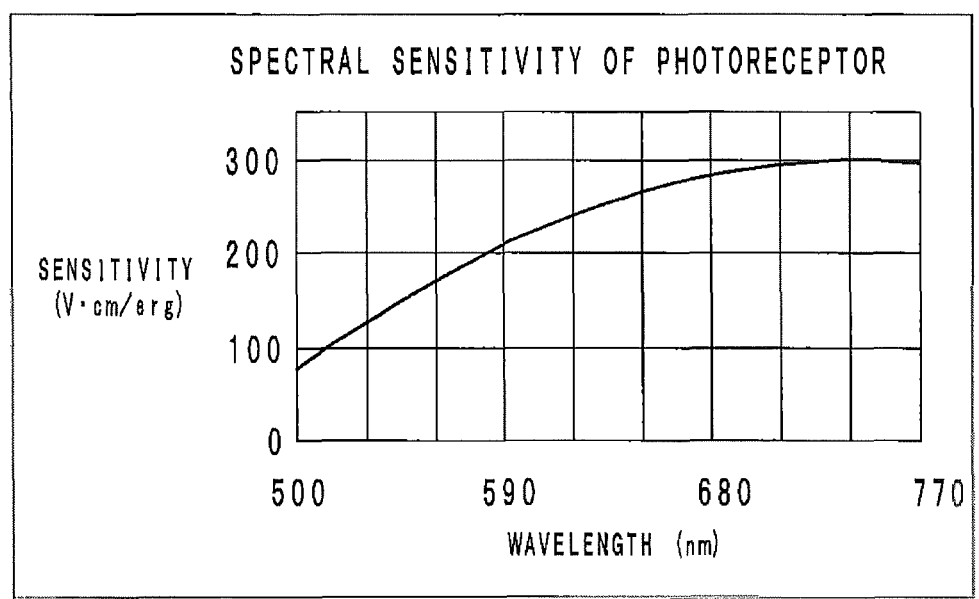
FIG. 24 is a graph showing a spectral sensitivity characteristic of a photoreceptor drum.

The photoreceptor drum 31 has a spectral sensitivity characteristic as described above (see FIG. 24), and the sensitivity of the photoreceptor drum 31 to light radiated thereto depends on the wavelength of the light. In the example shown by FIG. 24, when the peripheral surface of the photoreceptor drum 31 is exposed to long-wavelength light, the photoreceptor drum 31 is highly sensitive to the light, and the surface potential Vs becomes higher than the value calculated by the expression (3) above. On the contrary, when the peripheral surface of the photoreceptor drum 31 is exposed to short-wavelength light, the surface potential Vs becomes lower than the value calculated by the expression (3) above.

Also, as described above, when the ambient temperature is low, the photoreceptor drum 31, which is irradiated with light traveling in the direction of optical axis, is exposed to longer-wavelength light, and the surface potential Vs becomes higher than the value calculated by the expression (3) above. In view of these circumstances, a smaller value is set as the control coefficient $C_1$ for a case where the ambient temperature is lower and the wavelength of the non-outgoing light $L_2$ is longer. On the contrary, when the ambient temperature is high, the surface potential Vs of the photoreceptor drum 31 becomes lower. Therefore, a greater value is set as the control coefficient $C_1$ for a case where the ambient temperature is higher.

In this embodiment, in order to maintain the surface potential Vs at a constant level even with changes in ambient temperature, the control coefficient $C_1$ is used. As is apparent from the expressions (2) and (3) above, it is possible to maintain the surface potential Vs at a constant level by multiplying, for example, the predetermined intensity Po or the duty factor D with the control coefficient $C_1$.

With respect to each of the light-emitting elements $50A_1$ through $50A_n$, as shown by FIG. 10, the intensity P of light emitted therefrom changes linearly in relation to the drive current I input thereto. Therefore, the drive current Io allowing each of the light-emitting elements $50A_1$ through $50A_n$ to emit the predetermined intensity Po of output light is preliminarily known. The control circuit 53A picks up a value from the reference table 531A as the control coefficient $C_1$, depending on the ratio of amplitude levels of the signals $Si_1$ through $Si_8$. Next, the control circuit 53A calculates a temperature-compensated value Io' of the drive current Io by multiplying the drive current Io to be supplied to each of the light-emitting elements $50A_1$ through $50A_n$ with the control coefficient $C_1$. Thereafter, the control circuit 53A adjusts the intensity of output light from each of the light-emitting elements $50A_1$ through $50A_n$ by supplying the temperature-compensated current Io' to each of the light-emitting elements $50A_1$ through $50A_n$ while turning on/off each of the light-emitting elements $50A_1$ through $50A_n$ at the predetermined duty factor D. In this way, the surface potential Vs of the photoreceptor drum 31 can be maintained at a constant level.

In the description above, the control circuit 53A carries out temperature compensation by multiplying the intensity Po of output light from each of the light-emitting elements $50A_1$ through $50A_n$ with the control coefficient $C_1$. Alternatively, temperature compensation may be carried out by multiplying the duty factor D of each of the light-emitting elements $50A_1$ through $50A_n$ with the control coefficient $C_1$, as will be described below.

For example, as shown by the upper section of FIG. 11, during a specified period $T_1$, the control circuit 53A carries out temperature compensation by multiplying the intensity Po of output light from each of the light-emitting elements $50A_1$ through $50A_n$ with the control coefficient $C_1$ under the condition that the duty factor D of each of the light-emitting elements $50A_1$ through $50A_n$ is set to a predetermined value Do (=100%), and as a result, each of the light-emitting elements $50A_1$ through $50A_n$ emits light having an actual intensity Po' equal to Po×$C_1$. The same effect of this intensity adjustment can be obtained by carrying out duty-factor adjustment in the following manner. The control circuit 53A multiplies the predetermined duty factor Do of each of the light-emitting elements $50A_1$ through $50A_n$ with the control coefficient $C_1$, and turns on/off each of the light-emitting elements $50A_1$ through $50A_n$ at the calculated duty factor of Do×$C_1$. In the meantime, the intensity of output light from each of the light-emitting elements $50A_1$ through $50A_n$ is Po.

Thus, the same exposure energy E can be obtained in either way of the control shown by the upper section of FIG. 11 and the control shown by the lower section of FIG. 11. Consequently, the surface potential Vs of the photoreceptor drum 31 can be maintained at a constant level.

Operation and Effect of the Light-Emitting Elements

According to the first embodiment, each of the light-emitting elements $50A_1$ through $50A_n$ comprises a plurality of PDs $51A_1$ through $51A_8$. These PDs $51A_1$ through $51A_8$ are located in positions to be capable of receiving non-outgoing light $L_2$ total-reflected at the boundary surface between the transparent portion 86 and the outside, at different distances from the light-emitting point O. Because of the temperature characteristic of the light-emitting elements $50A_1$ through $50A_n$ that the spectral radiance of light emitted therefrom is changeable with changes in temperature, the reach of the total-reflected non-outgoing light $L_2$ in the M-axis direction changes with changes in ambient temperature. Accordingly, the intensities of light incident to the PDs $51A_1$ through $51A_8$ change with changes in ambient temperature, and therefore, a combination of amplitude levels of the output signals from the PDs $51A_1$ through $51A_8$ shows the ambient temperature. Thus, with the light-emitting elements $50A_1$ through $50A_n$ according to this embodiment, it is possible to detect a change in light distribution due to a change in ambient temperature.

Operation and Effect of the Image Forming Apparatus

In the image forming apparatus 1 comprising the light-emitting elements $50A_1$ through $50A_n$, the control circuit 53A selects a value appropriate for the ambient temperature as the control coefficient $C_1$, based on the serial data sent from the signal processing circuit 52A. The control circuit 53A carries out emission control of the light-emitting elements $50A_1$ through 50A. (exposure energy control) so as to prevent the surface potential Vs from changing with changes in ambient temperature. Thus, it is possible to prevent changes in image density due to the temperature characteristic of the light-emitting elements $50A_1$ through $50A_n$ that the spectral radiance of light emitted therefrom is changeable with changes in temperature.

First Modification

Next, referring to FIGS. 12 and 13, a light-emitting element 50B according to a first modification is described. The light-emitting element 50B comprises a plurality of light-emitting sections $58B_1$ through $58B_n$. The light-emitting sections $58B_1$ through $58B_n$ of the light-emitting element 50B are different from the light-emitting sections 58A in the following point. While a light-receiving section 51A is exclusively used for each of the light-emitting sections 58A, a light-receiving section 51B comprising p PDs $51B_1$ through $51B_p$ is shared by the light-emitting sections 58B. Also, the light-emitting element 50B comprises a signal processing circuit 52B instead of the signal processing section 52A. There are no other differences between the light-emitting elements 58A and the light-emitting elements $58B_1$ through $58B_n$. In FIG. 12, the components as shown in FIG. 3 are provided with the same reference marks as shown in FIG. 3, and descriptions of these components are omitted.

The light-emitting sections $58B_1$ through $58B_n$ are arranged in a line in the main-scanning direction (Y-axis direction) at uniform intervals and structured as a light-emitting element array. The light-emitting sections 58B are arranged at intervals of a distance x.

With respect to the light-receiving section 51B, the PDs $51B_1$ through $51B_p$ are structured as an array. Specifically, the PDs $51B_1$ through $51B_p$ are arranged in a line in the main-scanning direction (Y-axis direction) in parallel to the light-emitting element array at uniform intervals. The PDs are arranged at intervals of a distance calculated by dividing the distance x by an integer. The PDs $51B_1$ through $51B_p$ have light-receiving surfaces of a size, and the light-receiving surfaces are located in the same position as the anode 84 with respect to the N-axis direction. The PDs $51B_1$ through $51B_p$ output electric signals $Si_1$ through $Si_p$ to the signal processing circuits 52B, and the amplitude levels of the electric signals $Si_1$ through $Si_p$ are in correlation to the intensities of light incident to the respective light-receiving surfaces.

Among the PDs $51B_1$ through $51B_p$, for example, eight PDs $51B_1$ through $51B_8$ are used to detect the intensity of light emitted from the light-emitting section $58B_1$. Also, for example, the PDs $51B_3$ through $51B_{10}$ are used to detect the intensity of light emitted from the light-emitting section $58B_2$, and for example, the PDs $51B_5$ through $51B_{12}$ are used to detect the intensity of light emitted from the light-emitting section $58B_3$. In a similar way, eight PDs $51B_q$ through $51B_{q+7}$ are used to detect the intensity of light emitted from each of the other light-emitting sections $58B_4$ through $58B_n$.

The signal processing circuit 52B is located on the cathode 82 and is configured to receive the output signals from the PDs $51B_1$ to $51B_p$. The signal processing circuits 52B receives the output signals from the PDs $51B_q$ to $51B_{q+7}$ assigned to the corresponding light-emitting section 58B selected by a control circuit 53B as described below. In response, the signal processing circuit 52B generates serial data comprising time-series data of the amplitude levels of the signals $Si_q$ through $Si_{q+7}$, and outputs the data to the control circuit 53B.

The control circuit 53B, which is provided in the image forming apparatus 1, is connected to and data-communicable with the signal processing circuits 52B. The control circuit 53B comprises a microcomputer, a main memory, a non-volatile memory, etc. For light-intensity detection of the respective light-emitting sections $58B_1$ through $58B_n$, the control circuit 53B selects the light-emitting sections $58B_1$ through $58B_n$ one by one serially in a temporally non-overlapping manner, and while making the selected light-emitting section to emit light, the control circuit 53B activates the PDs $51B_q$ through $51B_{q+7}$ assigned thereto. Thereafter, the control circuit 53B receives the serial data about the selected light-emitting element from the signal processing circuit 52B, and carries out exposure energy control in the same way as described in the embodiment above. Since the control circuit 53B selects the light-emitting sections $58B_1$ through $58B_n$ one by one serially, the control circuit 53B obtains information about the correspondence relation between the signals $Si_q$ through $Si_{q+7}$ and the signals $Si_1$ through $Si_8$ by using a reading table 531B as shown by FIG. 13, and thereafter determines the control coefficient $C_1$ by using the reference table 531A.

Operation and Effect of the Light-Emitting Element

According to the first modification, the PDs $51B_1$ through $51B_p$ are shared by the plurality of light-emitting sections as described above, and therefore, it is possible to reduce the number of PDs.

Second Modification

Figure 14:
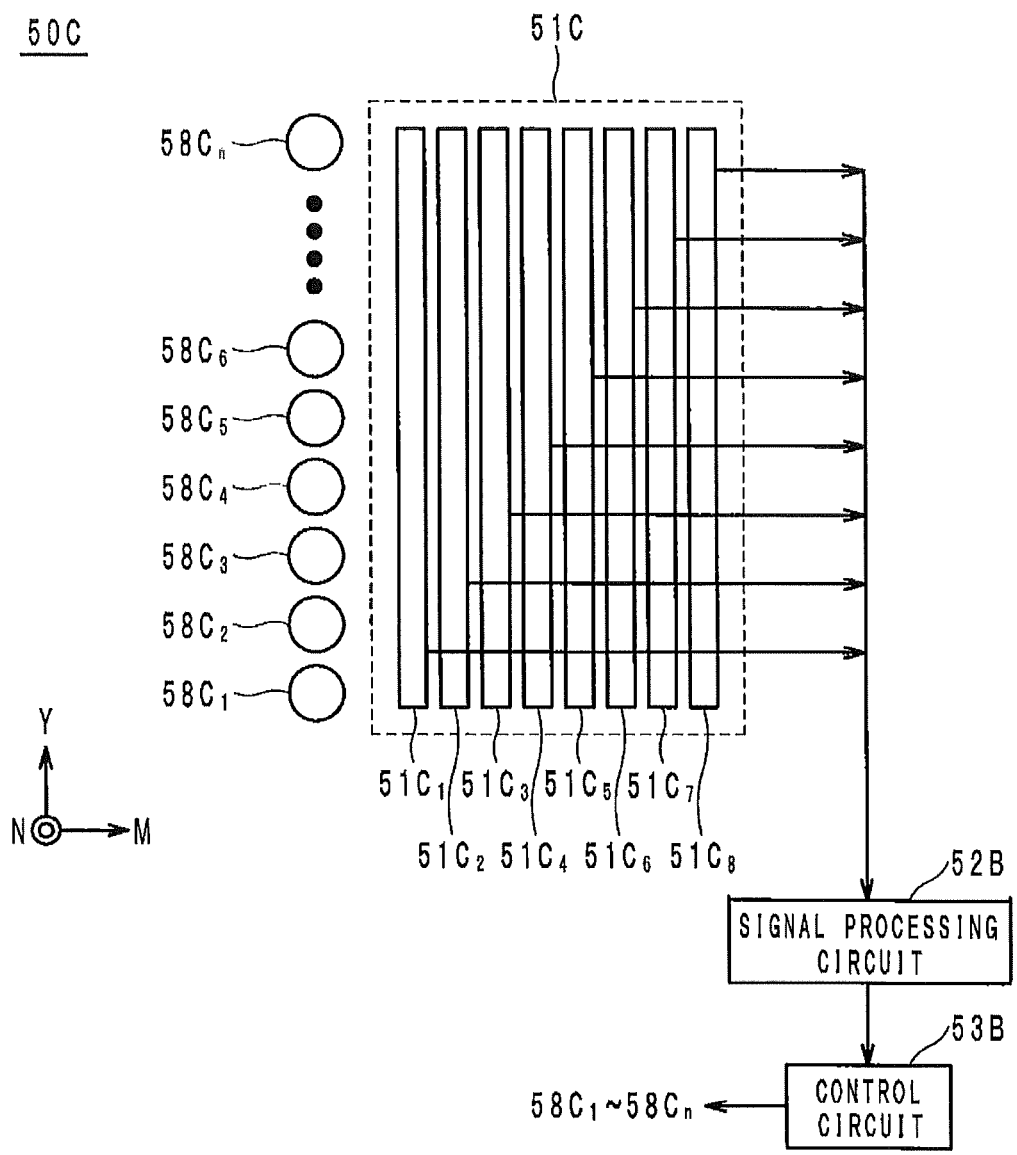
FIG. 14 is a schematic view of a light-emitting element according to a second modification.

Next, referring to FIG. 14, the detailed structure of a light-emitting element 50C according to a second embodiment is described. The light-emitting element 50C comprises a plurality of light-emitting sections $58C_1$ through $58C_n$. The light-emitting sections $58C_1$ through $58C_n$ of the light-emitting element 50C are different from the light-emitting sections 58A in the following point. While a light-receiving section 51A is exclusively used for each of the light emitting sections 58A, a light-receiving section 51C comprising a plurality of PDs (in the example shown by FIG. 14, eight PDs $51C_1$ through $51_8$) is shared by all of the light-emitting sections $51C_1$ through $51C_n$. There are no other differences between the light-emitting elements 58A and the light-emitting elements $58C_1$ through $50C_n$.

The PDs $51C_1$ through $51C_8$ are arranged in a line in the sub-scanning direction (M-axis direction) and structured as an array. In other words, the PDs $51C_1$ through $51C_8$ are located at different distances from each of the light-emitting points. The light-receiving surfaces of the PDs $51C_1$ through $51C_8$ are substantially equal in length (size in the Y-axis direction, that is, the main-scanning direction). The lengths of the light-receiving surfaces are designed such that the light-receiving surfaces are capable of receiving the non-outgoing light $L_2$ emitted from all of the light emitting elements $50C_1$ through $50C_n$.

Operation and Effect of the Light-Emitting Element

According to the second modification, the PDs $51C_1$ through $51C_8$, which have long light-receiving surfaces, are arranged in the sub-scanning direction at distances from the light-emitting sections $58C_1$ and $58C_n$ as described above. In the second modification, the reading table 531B used in the first modification is not necessary, which contributes to simplification of the control circuit 53A.

Notes 1

Figure 15:
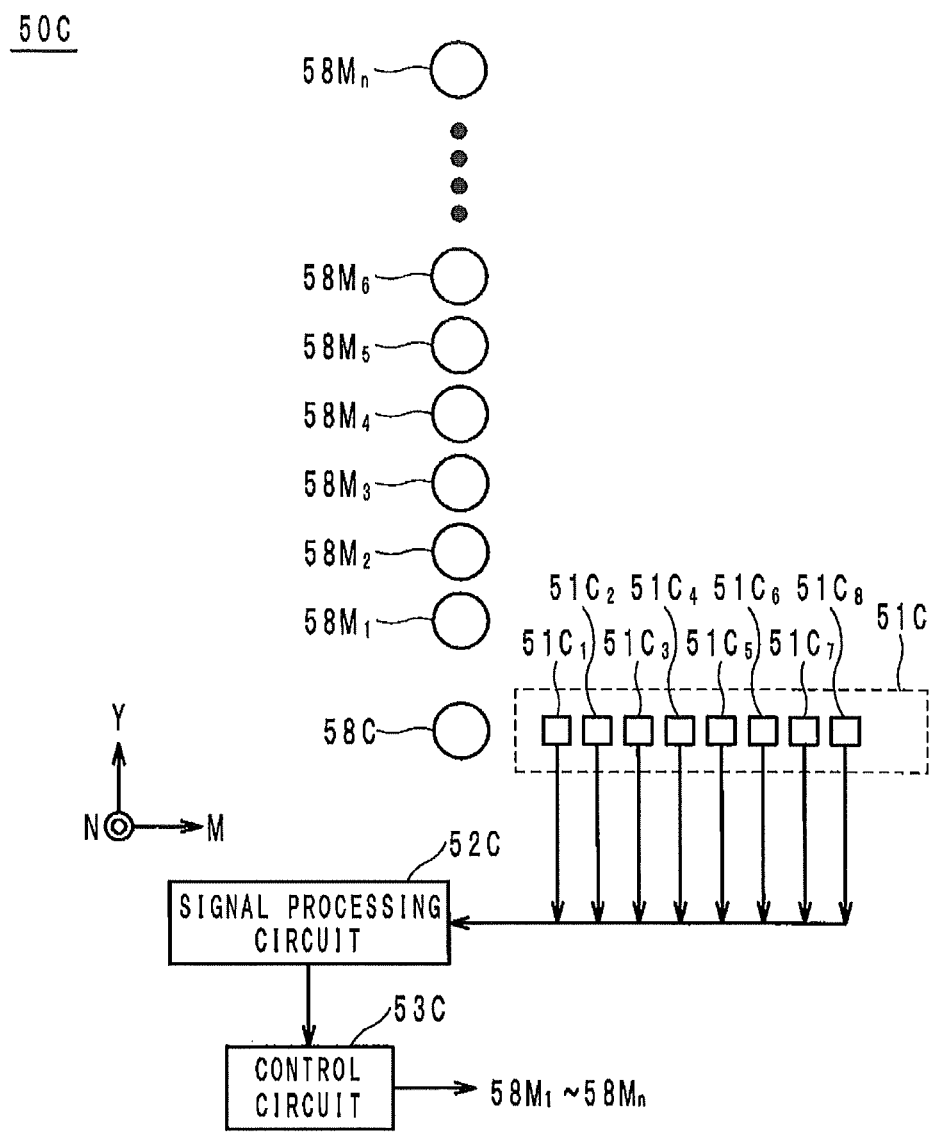
FIG. 15 is a schematic view of a light-emitting element including a light-emitting section used for intensity detection of the light.

In the first embodiment above, each of the light-emitting sections 58A is provided with a light-receiving section 51A for exclusive use. Alternatively, however, a structure as shown by FIG. 15 is possible. In the structure shown by FIG. 15, light-emitting sections $58M_1$ through $58M_n$ are provided to be used only for exposure of the photoreceptor drum 31, and light-intensity detection is not carried out with respect to these light-emitting sections $58M_1$ through $58M_n$. Additionally, a light-emitting section 58C, a light-receiving section 51C comprising a plurality of PDs $51C_1$ through $51C_8$, a signal processing circuit 52C and a control circuit 53C are provided only for light-intensity detection. The control circuit 53C determines the control coefficient $C_1$ in the same way as described in connection with the first embodiment, and carries out emission control of the light-emitting sections $58M_1$ through $58M_n$ by using the control coefficient $C_1$. This structure allows a reduction in number of PDs and a reduction in size of the light-emitting elements $50A_1$ through $50A_n$.

In the first embodiment above, each of the light-emitting sections 58A is provided with a light-receiving section 51A and a signal processing circuit 52A for exclusive use. Alternatively, however, only one of the light-emitting sections $58A_1$ through $58_n$ may be provided with a light-receiving section 51A and a signal processing circuit 52A. In this case, the control circuit 53A determines the control coefficient $C_1$ based on the serial data sent from the single signal processing circuit 52A, and carries out emission control of the light-emitting elements $50A_1$ through $50A_n$ by using the control coefficient $C_1$.

Second Embodiment

Figure 16:
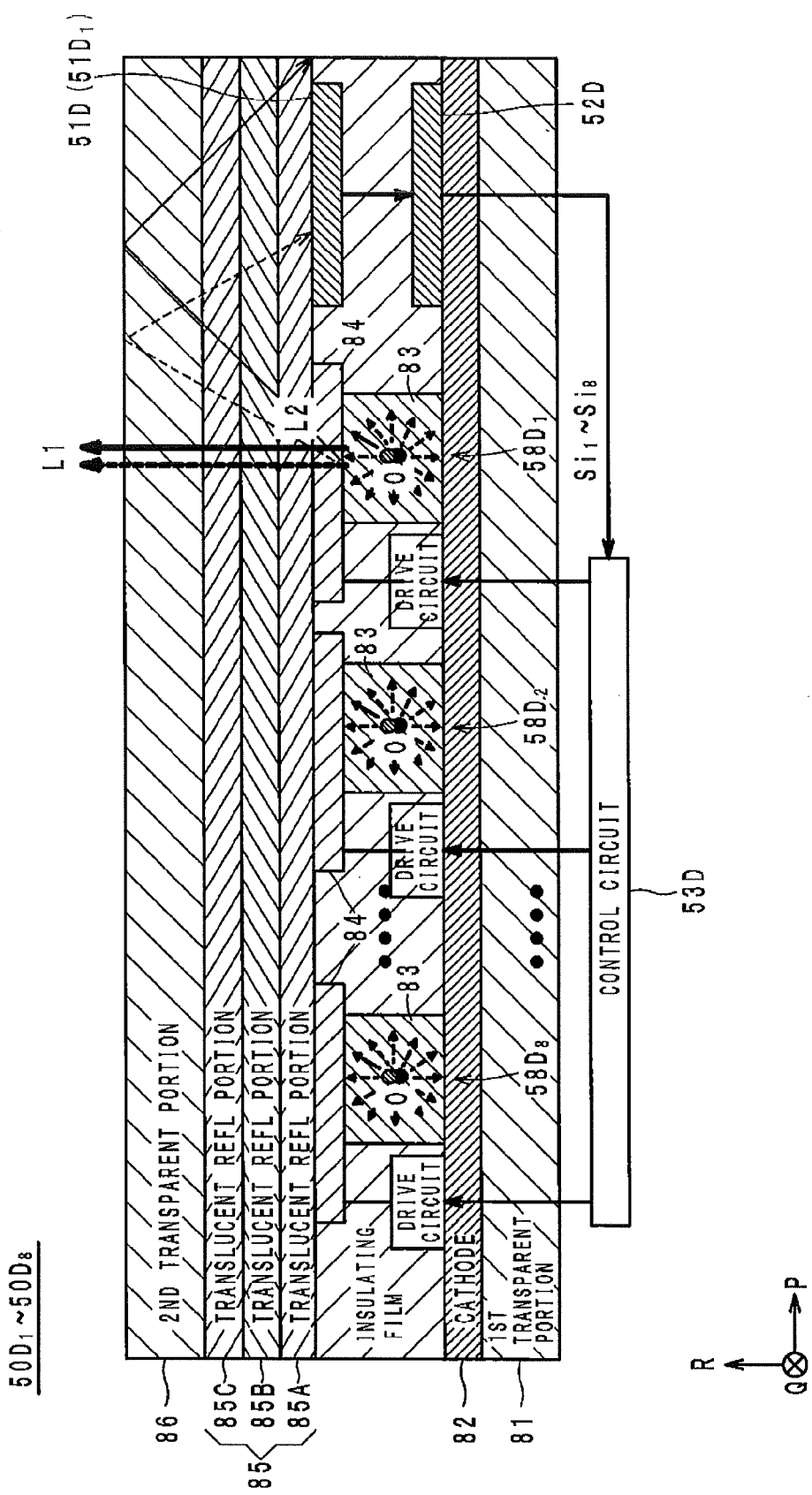
FIG. 16 is a longitudinal sectional view showing a detailed structure of a light-emitting element according to a second embodiment.
Figure 17:
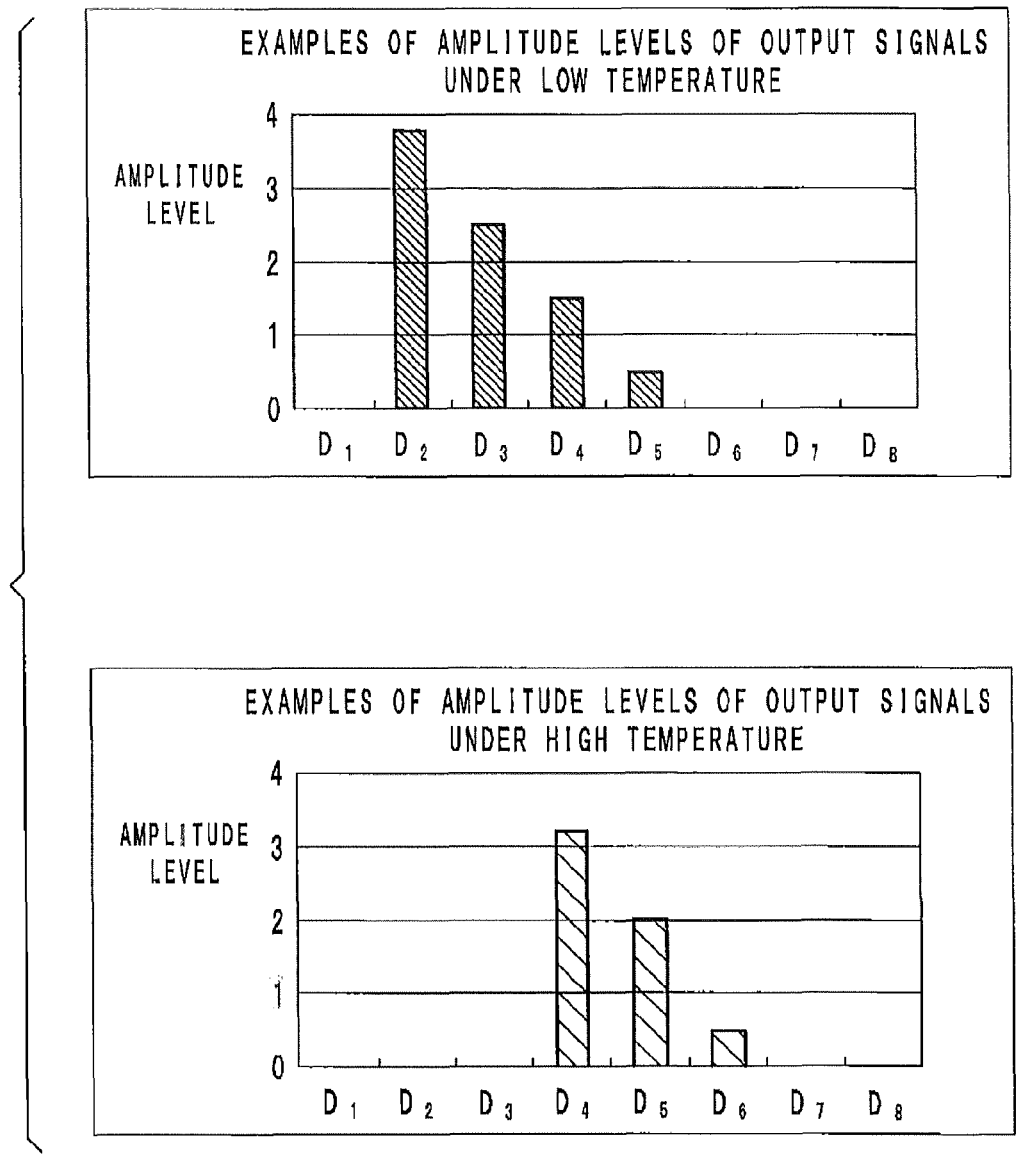
FIG. 17 shows graphs depicting amplitude levels of an output signal from a light-emitting element shown in FIG. 16, the graph in the upper section showing a combination of amplitude levels when the ambient temperature is low, and the graph in the lower section showing a combination of amplitude levels when the ambient temperature is high.

Next, referring to FIGS. 16 through 18, the detailed structure of each light-emitting element $50D_1$ through $50D_n$ according to a second embodiment is described.

First, the P-axis, the Q-axis and the R-axis shown in FIG. 16 are defined. The P-axis shows a direction in which light-emitting sections $58D_1$ through $58D_8$ are arranged, that is, a main-scanning direction. The R-axis shows a direction of optical axes of the light-emitting sections $58D_1$ through $58D_8$. The Q-axis shows a direction perpendicular to the P-axis and the R-axis.

In the second embodiment, around the light-emitting sections $58D_1$ through $58D_8$, a light-receiving section 51D, a signal processing circuit 52D and a control circuit 53D are provided. The light-receiving section 51D includes at least one PD $51D_1$.

Each of the light-emitting sections $58D_1$ through $58D_8$ is an OLED having an optical resonance structure. The light-emitting sections $58D_1$ through $58D_8$ are arranged in a line along the P-axis and structured as a light-emitting element array. Each of the light-emitting sections $58D_1$ through $58D_8$ is of the structure as described with reference to FIG. 21, and a detailed description thereof is omitted. For light-intensity detection, the control section 53D makes the light-emitting sections $58D_1$ through $58D_8$ emit light one by one serially in a temporally non-overlapping manner.

The PD $51D_1$ is located so as to be capable of receiving the non-outgoing light $L_2$ emitted from the light-emitting sections $58D_1$ through $58D_8$. The PD $51D_1$ may be located on the line connecting the light-emitting points of the light-emitting sections $58D_1$ through $58D_8$ or alternatively located in a different position in the Q-axis direction from the light-emitting sections $58D_1$ through $58D_8$. The PD $51D_1$ generates an electric signal Si having an amplitude level in correlation to the intensity of light incident thereto, and outputs the signal Si to the signal processing circuit 52D located in the subsequent stage. Since the light-emitting sections $58D_1$ through $58D_8$ emit light one by one serially as mentioned above, the electric signal Si, when viewed along the time axis, shows the intensities of non-outgoing light $L_2$ emitted from the light-emitting sections $58D_1$ through $58D_8$ and incident to the PD $51D_1$.

The signal processing circuit 52D is located on the cathode 82 and is configured to receive the output signal Si from the PD $51D_1$. The signal processing circuit 52D receives the signal Si from the PD $51D_1$. The signal processing circuit 52D carries out signal processing such as ADC or the like at time intervals between switches among the light-emitting sections $58D_1$ through $58D_8$, and outputs serial data showing, along the time axis, the intensities of outgoing light $L_2$ emitted from the light-emitting sections $58D_1$ through $58D_8$ to the control circuit 53D.

As described in connection with the first embodiment, the wavelength of the non-outgoing light $L_2$ emitted from the light-emitting sections $58D_1$ through $58D_8$ changes with changes in ambient temperature, and with the changes, the critical angle at the boundary surface between the transparent portion 86 and the outside changes. Consequently, the intensity of non-outgoing light $L_2$ emitted from the light-emitting sections $58D_1$ through $58D_8$ and incident to the PD $51D_1$, that is, the amplitude levels of the output signal Si change with changes in ambient temperature. The upper section of FIG. 17 shows the amplitude levels of the signal Si when the ambient temperature is low, and the lower section of FIG. 17 shows the amplitude levels of the signal Si when the ambient temperature is high.

The control circuit 53D, which is provided in the image forming apparatus 1, is connected to and data-communicable with the signal processing circuit 52D. The control circuit 53D comprises a microcomputer, a main memory, a non-volatile memory, etc.

In the non-volatile memory or the like of the control circuit 53D, a reference table 531C as shown by FIG. 18 is preliminarily stored. The reference table 531C shows control coefficients $C_1$ for various combination patterns of amplitude levels included in the serial data (that is, the output signal Si). The control coefficients $C_1$ are determined according to the relation between the spectral sensitivity of the photoreceptor drum 31 and the wavelength of the outgoing light $L_1$ traveling toward the photoreceptor drum 31. FIG. 18 shows exemplary control coefficients $C_1$ in a case where there are m combination patterns of amplitude levels. According to the reference table 531C, when the ratio of intensities of light emitted from the respective light-emitting sections $58D_1$ through $58D_8$ and incident to the PD $51D_1$, that is, the ratio of amplitude levels of the signal Si is in a first pattern (that is, $D_8:D_7:D_6:D_5:D_4:D_3:D_2:D_1=4.0:2.5:1.0:0.0:0.0:0.0:0.0:0.0$), the control coefficient $C_1$ is 1.5. This coefficient of 1.5 is used when the non-outgoing light $L_2$ is of a short wavelength and the ambient temperature is high (for example, 50 degrees C.). Also, when the ratio of intensities of light emitted from the respective light-emitting sections $58D_1$ through $58D_8$ and incident to the PD $51D_1$ is in an mth pattern (that is, $D_8:D_7:D_6:D_5:D_4:D_3:D_2:D_1=0.0:0.0:0.0:3.2:2.0:0.5:0.0:0.0$), the control coefficient $C_1$ is 0.7. This coefficient of 0.7 is used when the non-outgoing light $L_2$ is of a long wavelength and the ambient temperature is low (for example, 10 degrees C.).

The control circuit 53D picks up a value from the reference table 531C as the control coefficient $C_1$, depending on the ratio of amplitude levels of the signal Si, and then, the control circuit 53D carries out emission control of the light-emitting sections $58D_1$ through $58D_8$ by using the control coefficient $C_1$.

Notes 1

It is preferred that the light-emitting sections $58D_1$ through $58D_8$ are used in an image forming apparatus as a light-emitting element for exposure of a photoreceptor drum. This results in a reduction in size of the circuit.

However, when the light-emitting sections $58D_1$ through $58D_8$ are not used for exposure, the light-emitting points $O_1$ through $O_8$ of the light-emitting sections $58D_1$ through $58D_8$ and the PD $51D_1$ can be located in positions appropriate to the wavelength of light emitted from the light-emitting sections $58D_1$ through $58D_8$, regardless of the specifications of the image forming apparatus. This results in an improvement in accuracy of ambient temperature detection.

When the light-emitting sections $58D_1$ through $58D_8$ are used in an image forming apparatus, by arranging the PD $51D_1$ at a side of the light-emitting sections $58D_1$ through $58D_8$ in the sub-scanning direction, it is possible to reduce the size of the whole image forming apparatus in the main-scanning direction. On the other hand, by arranging the PD $51D_1$ at a side of the light-emitting sections $58D_1$ through $58D_8$ in the main-scanning direction, it is possible to reduce the size of the whole image forming apparatus in the sub-scanning direction, and it is also possible to locate the PD $51D_1$ and the signal processing circuit 52D separately from the light-emitting sections $58D_1$ through $58D_8$.

First Application

Figure 19:
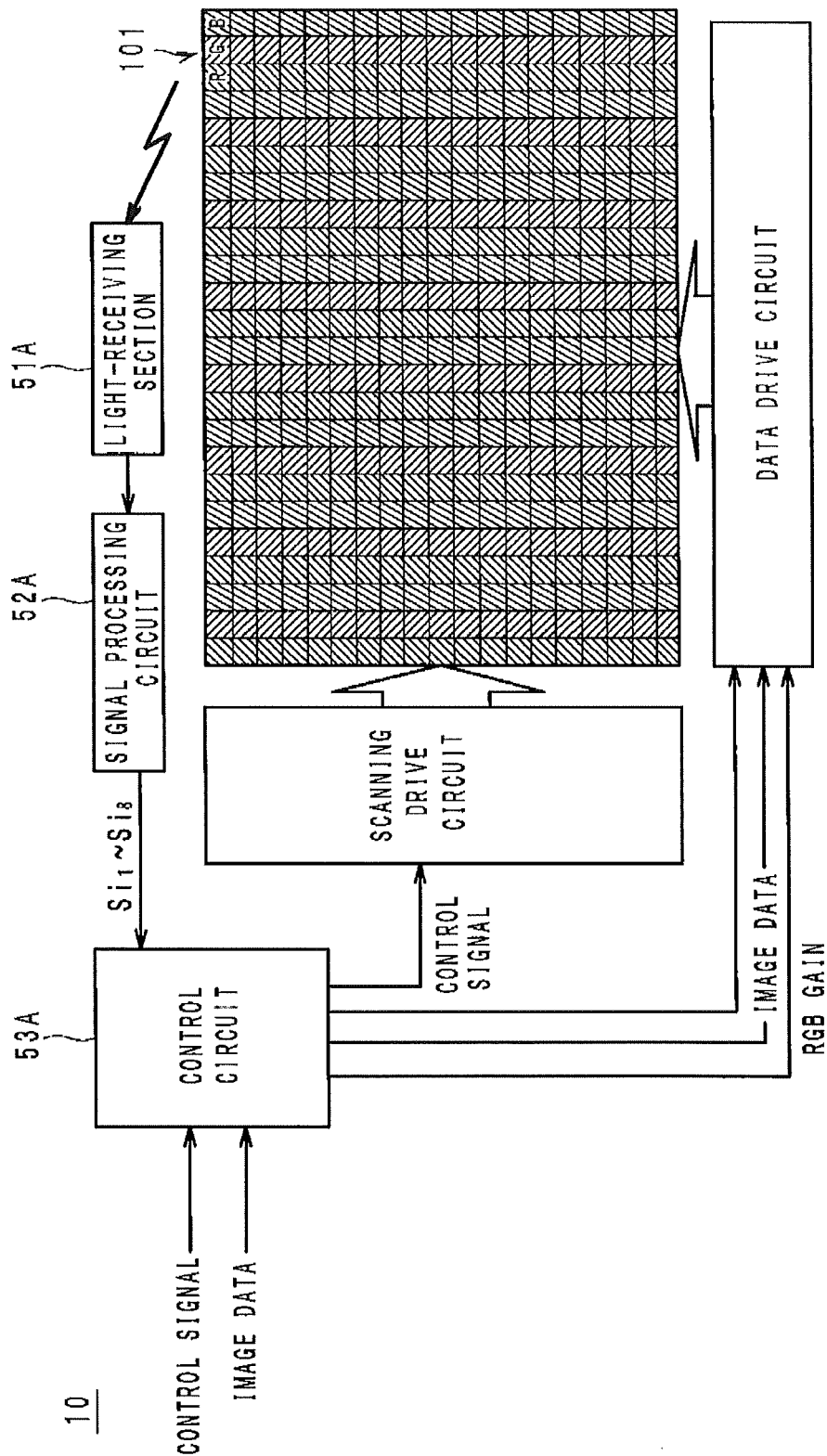
FIG. 19 is a schematic view showing a structure of an image display apparatus comprising the light-emitting element according to the first embodiment.

As is well known, an image display apparatus displays a full-color image by adjusting intensities of light emitted from light-emitting elements having wavelengths corresponding to colors of R, G and B, respectively. FIG. 19 shows such an image display apparatus 10. In FIG. 19, each light-emitting element is denoted by a reference mark 101. When each of the light-emitting elements 101 has an optical resonance structure, the image display apparatus 10 is capable of displaying a high-intensity directional image. However, because the spectral radiance of light emitted from each of the light-emitting elements 101 is changeable with changes in temperature, the color tone of a displayed image changes with changes in ambient temperature. In order to deal with this problem, in the image display apparatus 10, each of the light-emitting elements 101 is provided with a light-receiving section 51A, a signal processing circuit 52A and a control circuit 53A as described in connection with the first embodiment above. The light-receiving section 51A outputs an electric signal Si having an amplitude level in correlation to the intensity of non-outputting light $L_2$ emitted from the corresponding light-emitting element 101, which emits light of R, G or B, and incident thereto. The control circuit 53A determines a control coefficient $C_1$ based on serial data generated from the output signals $Si_1$ through $Si_8$ from the signal processing circuit 52A. The control circuit 53A controls the drive current for the light-emitting element 101 and the duty factor thereof by using the control coefficient $C_1$.

Second Application

Figure 20:
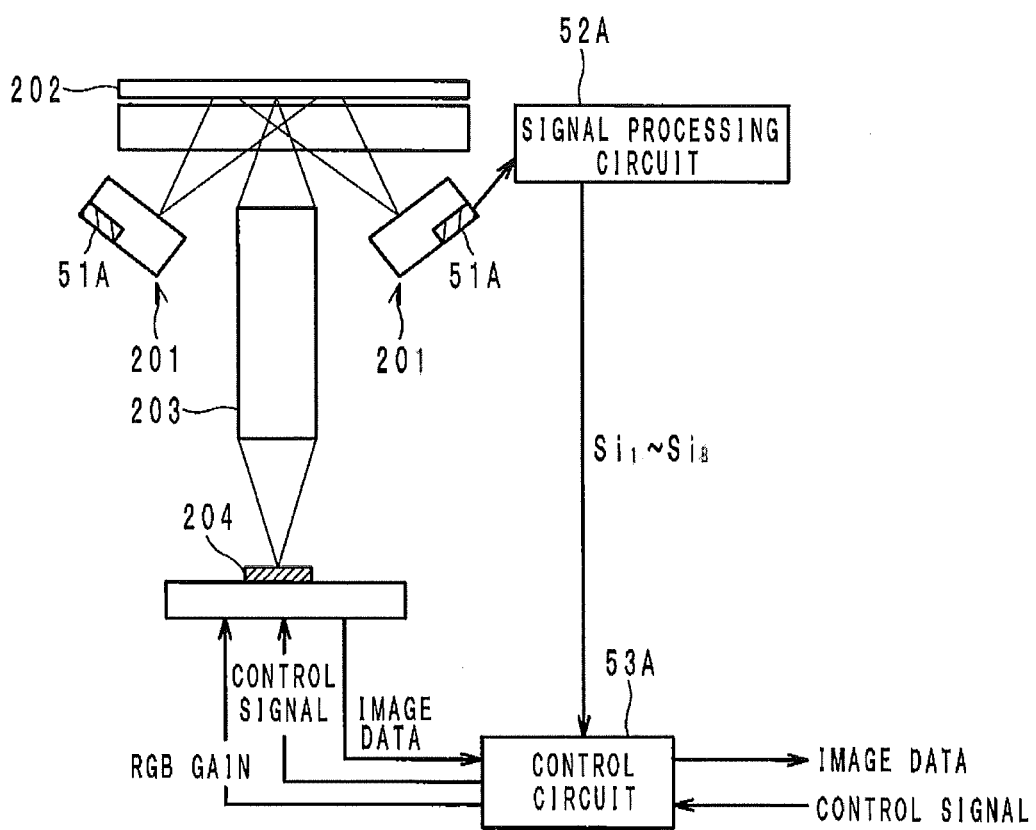
FIG. 20 is a schematic view showing a structure of an image reading apparatus comprising the light-emitting element according to the first embodiment.

In an image reading apparatus 20 as shown by FIG. 20, a document 202 is exposed to light emitted from a line light source 201, and light reflected from the document 202 is focused on a color line sensor 204 through a lens 203. Thereafter, the image reading apparatus 20 carries out photoelectric conversion of the light incident to the line sensor 204 and generates image data representing the image of the document.

When light-emitting elements having an optical resonance structure are used in the line light source 201, because the spectral radiance of light emitted from each of the light-emitting elements is changeable with changes in temperature, the color tone shown by the image data becomes different from the color tone of the image of the document 202 with a change in ambient temperature. In order to deal with this problem, in the image reading apparatus 20, each of the light-emitting elements of the line light source 201 is provided with a light-receiving section 51A, a signal processing circuit 52A and a control circuit 53A as described in connection with the first embodiment above. The light-receiving section 51A outputs signals $Si_1$ through $Si_8$ having amplitude levels in correlation to the intensity of light emitted from each of the light-emitting elements of the line light source 201. The control circuit 53A determines a control coefficient $C_1$ based on serial data generated from the output signals $Si_1$ through $Si_8$ from the signal processing circuit 52A. The control circuit 53A controls the gain of the line sensor 204 by using the control coefficient $C_1$.

Notes 2

In the embodiments above, each of the light-receiving sections 51A comprises a plurality of PDs $51A_1$ through $51A_8$. However, each of the light-receiving sections 51A may comprise at least one PD. The single PD outputs an electric signal having an amplitude level in correlation to the quantity of non-outgoing light $L_2$ received by the light-receiving surface thereof. The amplitude level of the signal shows the ambient temperature, and therefore, even a light-emitting element provided with only a single PD can detect the ambient temperature.

Although the present invention has been described in connection with the preferred embodiments above, it is to be noted that various changes and modifications may be apparent to a person skilled in the art. Such changes and modifications are to be understood as being within the scope of the invention.

What is claimed is:

1. A light-emitting element comprising:

a light-emitting section and a light-receiving section provided on a substrate, wherein the light-emitting section includes:

an anode and a cathode;

an organic compound provided between the anode and the cathode, wherein holes injected from the anode and electrons injected from the cathode couple with each other, thereby emitting light;

a translucent reflecting portion provided on the anode and making an optical resonance structure with the cathode, the translucent reflecting portion being configured to transmit the light emitted in the organic compound, the light having a spectral radiance that changes with changes in ambient temperature; and a transparent portion provided on the translucent reflecting portion and configured to radiate a first part of the light coming through the translucent reflecting portion to outside and to total-reflect a second part of the light coming through the translucent reflecting portion, the second part of the light being light incident to a boundary surface between the transparent portion and outside at angles larger than a critical angle; and wherein the light-receiving section includes a plurality of light receiving elements, each of the light receiving elements arranged at a unique distance from a location where the light is emitted from the organic compound, and each of the plurality of light receiving elements is configured to receive a respective portion of the light total-reflected at the boundary surface and is configured to output a signal that corresponds to an amount of light that is received by the respective light receiving element, the amount of light received by each of the plurality of light receiving elements changes with changes in wavelength of the light passing through the translucent reflecting portion, and the light receiving section is further configured to output a coefficient having an amplitude level in correlation to a pattern of the signals output by the light receiving elements.

2. An image display apparatus comprising the light-emitting element according to claim 1.

3. An image reading apparatus comprising the light-emitting element according to claim 1.

4. The light emitting element according to claim 1, further comprising a controller for controlling an intensity of the light emitted by the light emitting section based on the output coefficient.

5. An image forming apparatus comprising:

a photoreceptor;

a print head including a light-emitting element array having a plurality of light-emitting elements arranged in a main-scanning direction, each of the light-emitting elements having a plurality of light-emitting sections and a plurality of light-receiving elements provided on a substrate, wherein each of the light-receiving elements is configured so as to be shared by all of the light-emitting sections; and a control circuit carrying out emission control of each of the light-emitting sections based on a combination of amplitude levels of output signals from the light-receiving elements;

wherein each of the light-emitting sections includes:

an anode and a cathode;

an organic compound provided between the anode and the cathode, wherein holes injected from the anode and electrons injected from the cathode couple with each other, thereby emitting light;

a translucent reflecting portion provided on the anode and making an optical resonance structure with the cathode, the translucent reflecting portion being configured to transmit the light emitted in the organic compound, the light having a spectral radiance that changes with changes in ambient temperature; and a transparent portion provided on the translucent reflecting portion and configured to radiate a first luminous flux of the light passing through the translucent reflecting portion to outside while total-reflecting a second part of the light passing through the translucent reflecting portion, the second part of the light being light incident to an boundary surface between the transparent portion and outside at angles larger than a critical angle;

wherein the plurality of light-receiving elements are arranged to receive the light total-reflected at the boundary surface and configured to output signals respectively having amplitude levels in correlation to intensities of light incident thereto, the intensities of light incident to the light-receiving elements changing with changes in wavelength of the light;

wherein the plurality of light-receiving elements are located at different distances from a light-emitting point in the organic compound of one of the light-emitting sections and arranged to be capable of receiving the light total-reflected at the boundary surface and having spectral radiance that changes with changes in ambient temperature; and wherein the print head is configured to be controlled by the control circuit to scan a light beam on a peripheral surface of the photoreceptor in the main-scanning direction.

6. The image forming apparatus according to claim 5, wherein the control circuit has a reference table preliminary stored therein, the reference table including control coefficients compensating the temperature characteristic of the light-emitting sections of emitting light having spectral radiance changeable with changes in ambient temperature for various combinations of amplitude levels of the output signals from the light-receiving elements; and wherein, on receiving the output signals from the light-receiving elements, the control circuit obtains a control coefficient appropriate to the combination of amplitude levels of the received signals and adjusts exposure energy to be output from the print head by carrying out emission control of the light-emitting sections based on the obtained control coefficient.

7. The image forming apparatus according to claim 6, wherein the control circuit carries out emission control of each of the light-emitting sections by adjusting a quantity of light to be emitted from each of the light-emitting sections.

8. The image forming apparatus according to claim 6, wherein the control circuit carries out emission control of each of the light-emitting sections by adjusting a duty factor to be used for emission of each of the light-emitting sections.

9. The image forming apparatus according to claim 5, wherein the plurality of light-receiving elements are arranged in the main-scanning direction.

10. The image forming apparatus according to claim 5, wherein the plurality of light-receiving elements are arranged in a sub-scanning direction perpendicular to the main-scanning direction.

11. The image forming apparatus according to claim 5,
wherein a predetermined number of light-receiving elements selected from among the light-receiving elements are assigned to each of the light-emitting sections such that the predetermined number of light-receiving elements assigned to one of the light-emitting sections includes at least one light-receiving element to be assigned also to another of the light-emitting sections; and
wherein, while selecting the light-emitting sections one by one to emit light, the control circuit activates the predetermined number of light-receiving elements assigned to the selected light-emitting section, and thereafter carries out emission control of the selected light-emitting section based on a combination of amplitude levels of the output signals from the activated light-receiving elements.

12. The image forming apparatus according to claim 5, wherein, when the light-emitting sections are arranged at intervals of a distance x, the light-receiving elements are arranged at intervals of a distance calculated by dividing the distance x by an integer.

13. An image forming apparatus comprising:
a photoreceptor;
a print head including a light-emitting element array having a plurality of light-emitting elements arranged in a main-scanning direction, each of the light-emitting elements including a plurality of light-emitting sections and a light-receiving section provided on a substrate; and
a control circuit configured to carry out emission control of each of the light-emitting sections based on an output signal from the light-receiving section;
wherein each of the light-emitting sections includes:
an anode and a cathode;
an organic compound provided between the anode and the cathode, wherein holes injected from the anode and electrons injected from the cathode couple with each other, thereby emitting light;
a translucent reflecting portion provided on the anode and making an optical resonance structure with the cathode, the translucent reflecting portion being configured to transmit the light emitted in the organic compound, the light having spectral radiance that changes with changes in ambient temperature; and
a transparent portion provided on the translucent reflecting portion and configured to radiate a first luminous flux of the light coming through the translucent reflecting portion to outside and to total-reflect a second part of the light coming through the translucent reflecting portion, the second part of the light being light incident to a boundary surface between the transparent portion and outside at angles larger than a critical angle;
wherein the light-receiving section is arranged to be capable of receiving the light total-reflected at the boundary surface and configured to output a signal having an amplitude level in correlation to a quantity of light incident thereto, the quantity of light incident to the light-receiving section that changes with changes in wavelength of the light;
wherein the print head is configured to scan a light beam on a peripheral surface of the photoreceptor in the main-scanning direction under emission control of the control circuit; and
wherein the control circuit selects the plurality of light-emitting sections one by one serially to emit light, and carries out emission control of the selected one of light-emitting sections based on a combination of amplitude levels of the output signal from the light-receiving section.

14. The image forming apparatus according to claim 13, wherein the light-receiving section is located separate from the light-emitting elements in the main-scanning direction.

* * * * *